US012707926B2

(12) United States Patent
Moriya et al.

(10) Patent No.: US 12,707,926 B2
(45) Date of Patent: Aug. 11, 2026

(54) DATA COLLECTION SYSTEM, DATA COLLECTION APPARATUS, DATA COLLECTION METHOD, AND DATA COLLECTION PROGRAM

(71) Applicant: Tokyo Electron Limited, Tokyo (JP)

(72) Inventors: Tsuyoshi Moriya, Tokyo (JP); Hironori Moki, Miyagi (JP); Kazuya Uoyama, Hokkaido (JP); Takahito Matsuzawa, Hokkaido (JP); Yuki Kataoka, Hokkaido (JP)

(73) Assignee: Tokyo Electron Limited, Tokyo (JP)

(*) Notice: Subject to any disclaimer, the term of this patent is extended or adjusted under 35 U.S.C. 154(b) by 407 days.

(21) Appl. No.: 18/455,067

(22) Filed: Aug. 24, 2023

(65) Prior Publication Data

US 2023/0395411 A1 Dec. 7, 2023

Related U.S. Application Data

(63) Continuation of application No. PCT/JP2022/006954, filed on Feb. 21, 2022.

(30) Foreign Application Priority Data

Mar. 2, 2021 (JP) ................................ 2021-032890

(51) Int. Cl.
*G05B 19/401* (2006.01)
*G01N 21/95* (2006.01)
(Continued)

(52) U.S. Cl.
CPC ..... *H10P 72/0616* (2026.01); *G01N 21/9501* (2013.01); *G05B 19/401* (2013.01);
(Continued)

(58) Field of Classification Search
USPC ......................................................... 700/110
See application file for complete search history.

(56) References Cited

U.S. PATENT DOCUMENTS 5,783,804 A * 7/1998 Burke .................... G05D 23/26 374/161
7,561,251 B2 * 7/2009 Van Der Feltz ........ G03F 7/705 355/53
(Continued)

FOREIGN PATENT DOCUMENTS

JP 2004-025058 1/2004
JP 2008-034877 2/2008
(Continued)

*Primary Examiner* — Hien D Khuu
(74) *Attorney, Agent, or Firm* — IPUSA, PLLC

(57) ABSTRACT

A data collection system includes: a first substrate processing apparatus having a first processing space, a second substrate processing apparatus having a second processing space, and a data collection apparatus connected to the first substrate processing apparatus and the second substrate processing apparatus. The data collection apparatus is configured to compare observed data observed when substrates having the same or similar shapes are processed under the same processing conditions in the first processing space and the second processing space, respectively, and calculate a correction amount for correcting the observed data observed when being processed in the second processing space, and correct the observed data observed when being processed in the second processing space based on the correction amount, and collect corrected observed data, when searching for a processing condition by processing substrates while changing the processing condition in the second processing space.

16 Claims, 14 Drawing Sheets

(51) Int. Cl.

| | |
|---|---|
| ***G05B 19/418*** | (2006.01) |
| ***H05H 1/00*** | (2006.01) |
| ***H10P 72/00*** | (2026.01) |
| ***H10P 95/00*** | (2026.01) |

(52) U.S. Cl.

CPC ..... *G05B 19/41875* (2013.01); *H05H 1/0006* (2013.01); *H10P 95/00* (2026.01); *G05B 2219/45031* (2013.01)

(56) References Cited

U.S. PATENT DOCUMENTS

| | | | | |
|---|---|---|---|---|
| 11,698,346 | B2 * | 7/2023 | Barbu | G01N 21/95607 382/145 |
| 2002/0028523 | A1 * | 3/2002 | Toyama | G03F 7/70441 438/14 |
| 2003/0177467 | A1 * | 9/2003 | Ohnuma | G03F 7/70441 716/52 |
| 2006/0199089 | A1 * | 9/2006 | Watanabe | G03F 7/70625 430/30 |
| 2008/0110233 | A1 * | 5/2008 | Tanaka | H01L 22/26 73/23.21 |
| 2010/0290886 | A1 | 11/2010 | Hashimoto et al. | |
| 2013/0147942 | A1 * | 6/2013 | Lin | G06V 30/1444 348/87 |
| 2015/0205216 | A1 * | 7/2015 | Lin | H01L 21/67092 355/72 |
| 2018/0239267 | A1 * | 8/2018 | Queens | G03F 9/7049 |
| 2018/0358271 | A1 * | 12/2018 | David | H01L 21/67253 |
| 2019/0072496 | A1 * | 3/2019 | Barbu | G01N 21/8806 |
| 2020/0072761 | A1 * | 3/2020 | Koopman | G03F 7/70625 |
| 2020/0264513 | A1 | 8/2020 | Yamamoto et al. | |

FOREIGN PATENT DOCUMENTS

| | | |
|---|---|---|
| JP | 2011-071296 | 4/2011 |
| JP | 2019-159864 | 9/2019 |
| JP | 2019-207951 | 12/2019 |
| KR | 10-2017-0086585 | 7/2017 |
| WO | 2016/086138 | 6/2016 |

* cited by examiner

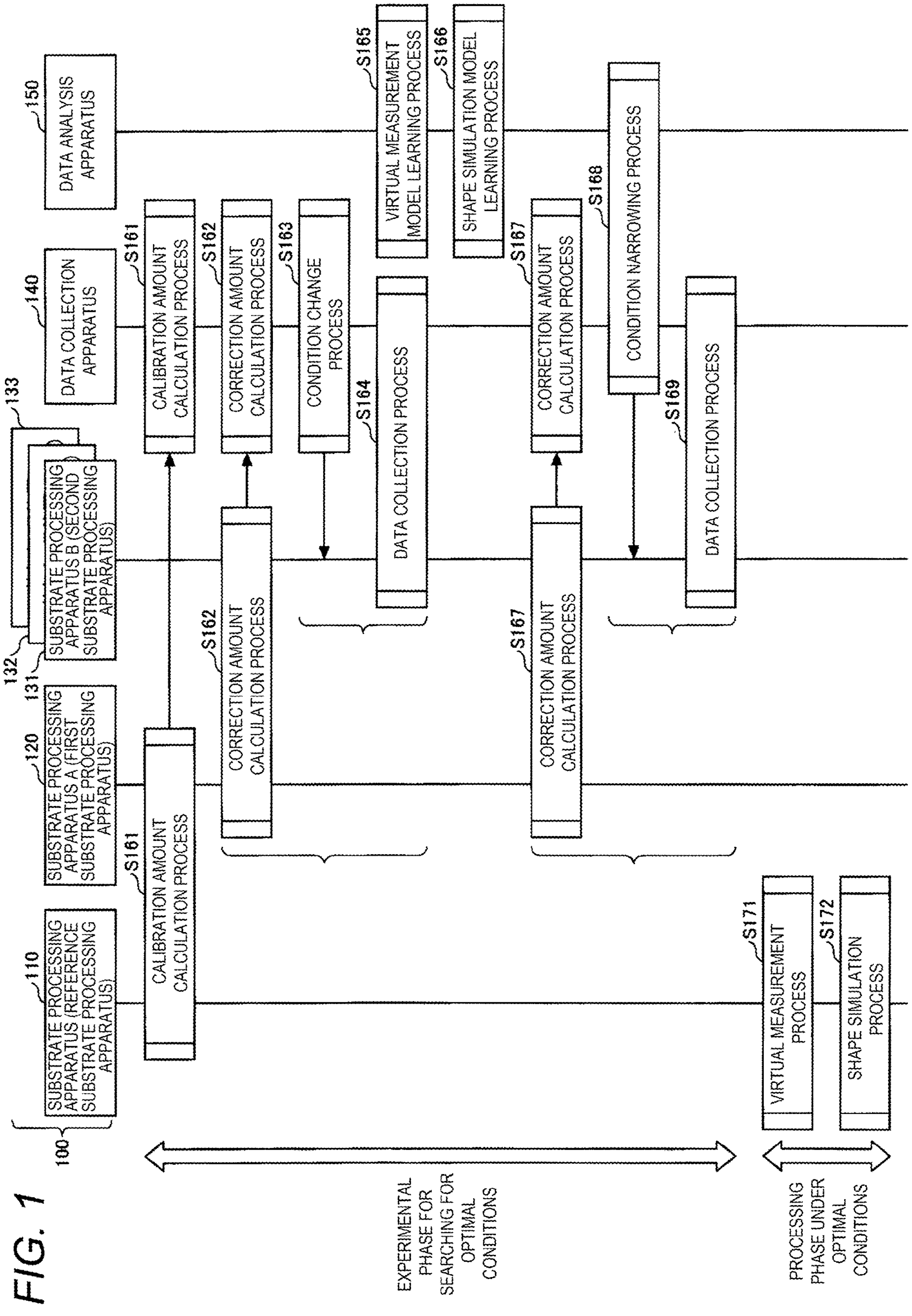

FIG. 1
100
110
SUBSTRATE PROCESSING APPARATUS (REFERENCE SUBSTRATE PROCESSING APPARATUS)
120
SUBSTRATE PROCESSING APPARATUS A (FIRST SUBSTRATE PROCESSING APPARATUS)
131
132
133
SUBSTRATE PROCESSING APPARATUS B (SECOND SUBSTRATE PROCESSING APPARATUS)
140
DATA COLLECTION APPARATUS
150
DATA ANALYSIS APPARATUS
S161
CALIBRATION AMOUNT CALCULATION PROCESS
S161
CALIBRATION AMOUNT CALCULATION PROCESS
S162
CORRECTION AMOUNT CALCULATION PROCESS
S162
CORRECTION AMOUNT CALCULATION PROCESS
S163
CONDITION CHANGE PROCESS
S164
DATA COLLECTION PROCESS
S165
VIRTUAL MEASUREMENT MODEL LEARNING PROCESS
S166
SHAPE SIMULATION MODEL LEARNING PROCESS
S167
CORRECTION AMOUNT CALCULATION PROCESS
S167
CORRECTION AMOUNT CALCULATION PROCESS
S168
CONDITION NARROWING PROCESS
S169
DATA COLLECTION PROCESS
EXPERIMENTAL PHASE FOR SEARCHING FOR OPTIMAL CONDITIONS
S171
VIRTUAL MEASUREMENT PROCESS
S172
SHAPE SIMULATION PROCESS
PROCESSING PHASE UNDER OPTIMAL CONDITIONS

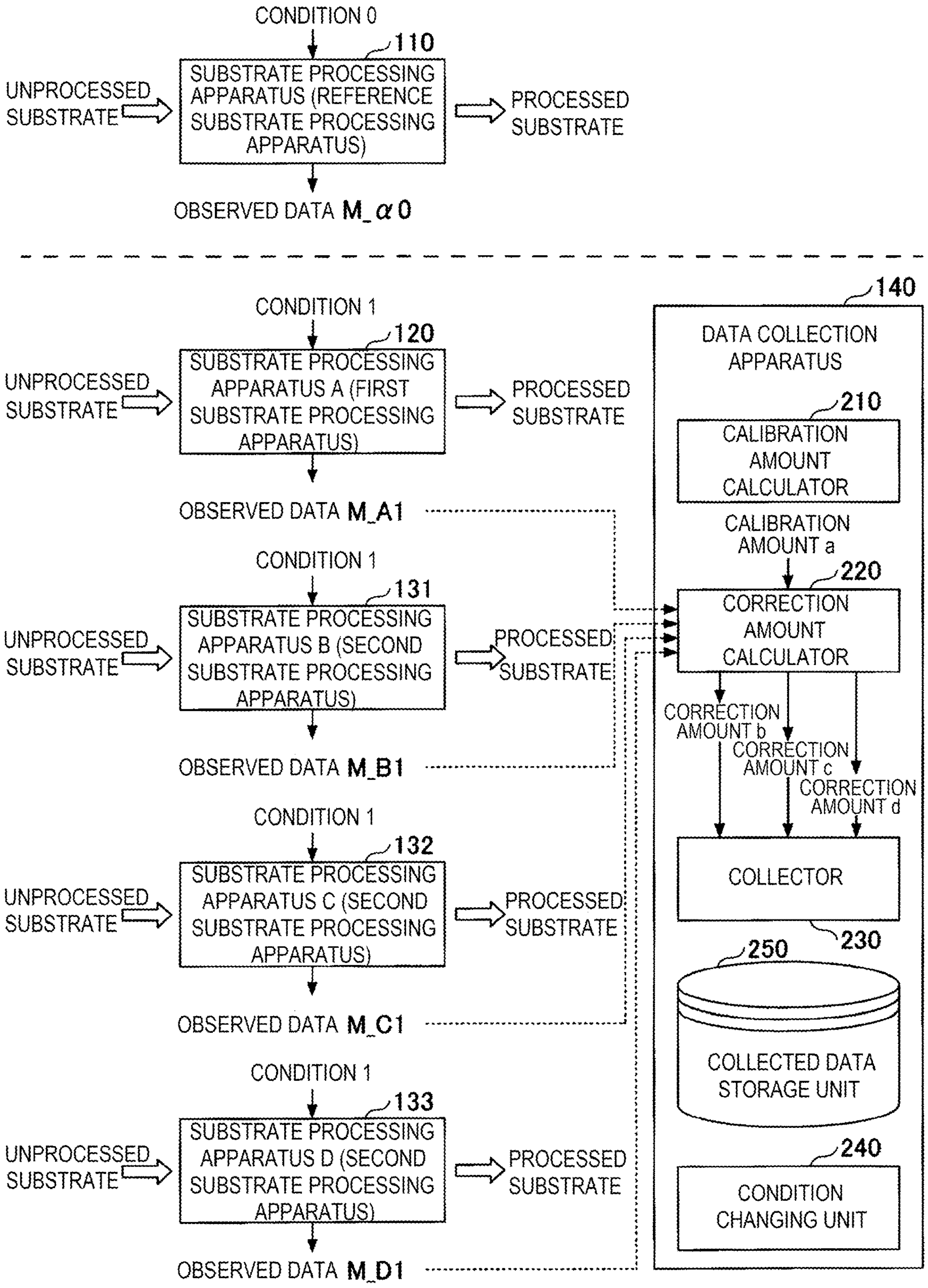

FIG. 3

CONDITION 1
120
UNPROCESSED SUBSTRATE
SUBSTRATE PROCESSING APPARATUS A (FIRST SUBSTRATE PROCESSING APPARATUS)
PROCESSED SUBSTRATE
OBSERVED DATA M_A1

CONDITION 1
131
UNPROCESSED SUBSTRATE
SUBSTRATE PROCESSING APPARATUS B (SECOND SUBSTRATE PROCESSING APPARATUS)
PROCESSED SUBSTRATE
OBSERVED DATA M_B1

CONDITION 1
132
UNPROCESSED SUBSTRATE
SUBSTRATE PROCESSING APPARATUS C (SECOND SUBSTRATE PROCESSING APPARATUS)
PROCESSED SUBSTRATE
OBSERVED DATA M_C1

CONDITION 1
133
UNPROCESSED SUBSTRATE
SUBSTRATE PROCESSING APPARATUS D (SECOND SUBSTRATE PROCESSING APPARATUS)
PROCESSED SUBSTRATE
OBSERVED DATA M_D1

140
DATA COLLECTION APPARATUS
210
CALIBRATION AMOUNT CALCULATOR
CALIBRATION AMOUNT a
220
CORRECTION AMOUNT CALCULATOR
CORRECTION AMOUNT b
CORRECTION AMOUNT c
CORRECTION AMOUNT d
COLLECTOR
230
250
COLLECTED DATA STORAGE UNIT
240
CONDITION CHANGING UNIT

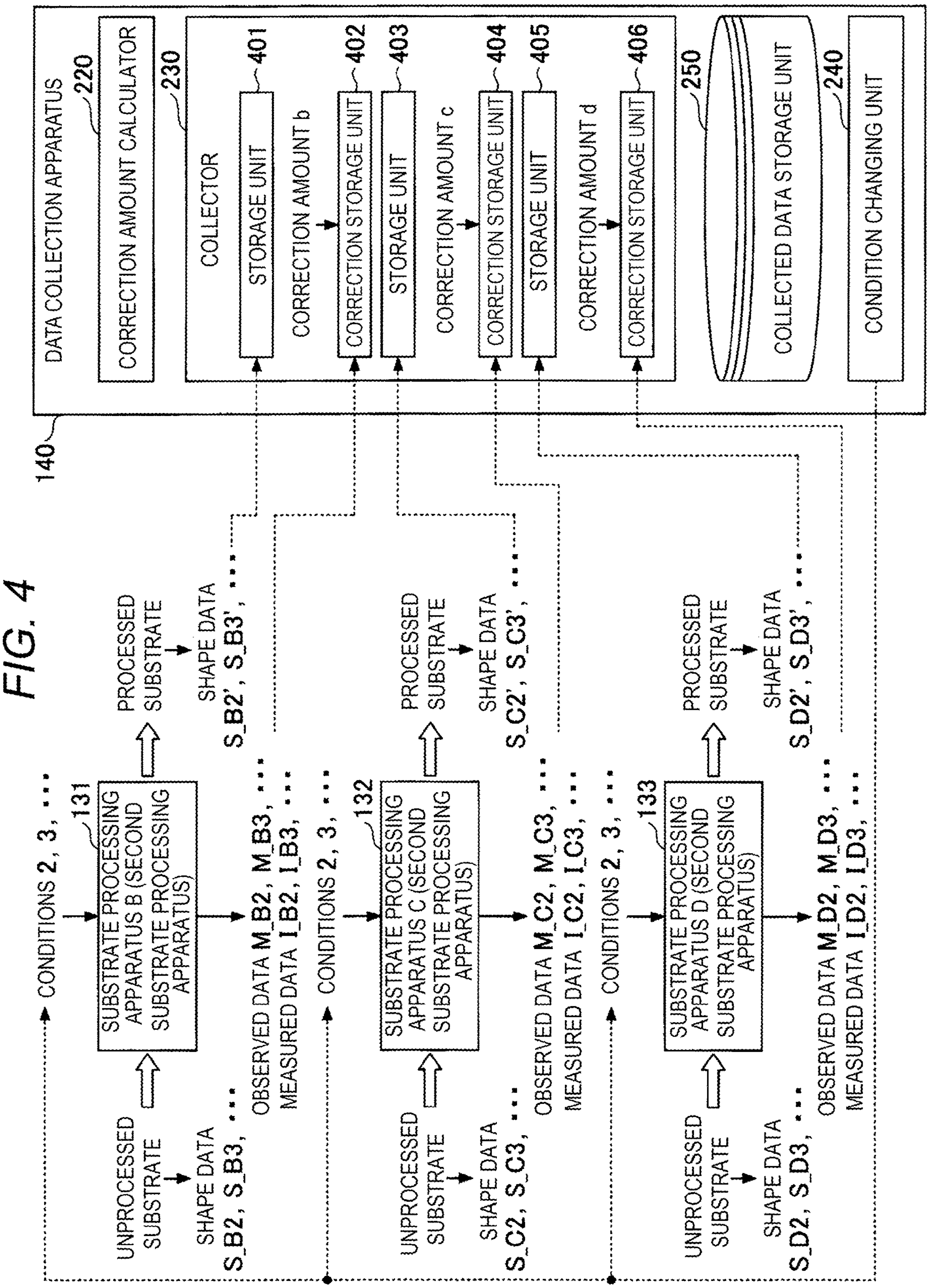

FIG. 4
CONDITIONS 2, 3, ...
131
SUBSTRATE PROCESSING APPARATUS B (SECOND SUBSTRATE PROCESSING APPARATUS)
UNPROCESSED SUBSTRATE
SHAPE DATA
S_B2, S_B3, ...
PROCESSED SUBSTRATE
SHAPE DATA
S_B2', S_B3', ...
OBSERVED DATA M_B2, M_B3, ...
MEASURED DATA I_B2, I_B3, ...
CONDITIONS 2, 3, ...
132
SUBSTRATE PROCESSING APPARATUS C (SECOND SUBSTRATE PROCESSING APPARATUS)
UNPROCESSED SUBSTRATE
SHAPE DATA
S_C2, S_C3, ...
PROCESSED SUBSTRATE
SHAPE DATA
S_C2', S_C3', ...
OBSERVED DATA M_C2, M_C3, ...
MEASURED DATA I_C2, I_C3, ...
CONDITIONS 2, 3, ...
133
SUBSTRATE PROCESSING APPARATUS D (SECOND SUBSTRATE PROCESSING APPARATUS)
UNPROCESSED SUBSTRATE
SHAPE DATA
S_D2, S_D3, ...
PROCESSED SUBSTRATE
SHAPE DATA
S_D2', S_D3', ...
OBSERVED DATA M_D2, M_D3, ...
MEASURED DATA I_D2, I_D3, ...
140
DATA COLLECTION APPARATUS
220
CORRECTION AMOUNT CALCULATOR
230
COLLECTOR
STORAGE UNIT
401
CORRECTION AMOUNT b
CORRECTION STORAGE UNIT
402
STORAGE UNIT
403
CORRECTION AMOUNT c
CORRECTION STORAGE UNIT
404
STORAGE UNIT
405
CORRECTION AMOUNT d
CORRECTION STORAGE UNIT
406
250
COLLECTED DATA STORAGE UNIT
240
CONDITION CHANGING UNIT

| COLLECTED DATA | | | | |
|---|---|---|---|---|
| PROCESSING CONDITIONS | OBSERVED DATA | MEASURED DATA | UNPROCESSED SUBSTRATE SHAPE DATA | PROCESSED SUBSTRATE SHAPE DATA |
| - POWER FROM RADIO-FREQUENCY POWER SUPPLY<br>- POWER FROM LOW-FREQUENCY POWER SUPPLY<br>- PRESSURE<br>- TEMPERATURE<br>- GAS FLOW RATE<br>- GAS TYPE<br>⋮ | - DC SELF-BIAS VOLTAGE<br>- POTENTIAL DIFFERENCE<br>- REFLECTED WAVE POWER<br>- GAS FLOW RATE<br>- PLASMA DENSITY<br>- ION ENERGY<br>- ION FLOW RATE<br>⋮ | - PLASMA MEASURED DATA<br>- CONSUMPTION AMOUNT MEASURED DATA<br>- PARTICLE MEASURED DATA | - CRITICAL DIMENSION<br>- DEPTH<br>- TAPER ANGLE<br>- TILT ANGLE<br>- BOWING<br>⋮ | - CRITICAL DIMENSION<br>- DEPTH<br>- TAPER ANGLE<br>- TILT ANGLE<br>- BOWING<br>⋮ |
| CONDITION 2 | OBSERVED DATA **M_B2**,<br>OBSERVED DATA **M_C2**,<br>OBSERVED DATA **M_D2** | MEASURED DATA **I_B2**,<br>MEASURED DATA **I_C2**,<br>MEASURED DATA **I_D2** | SHAPE DATA **S_B2**,<br>SHAPE DATA **S_C2**,<br>SHAPE DATA **S_D2** | SHAPE DATA **S_B2'**,<br>SHAPE DATA **S_C2'**,<br>SHAPE DATA **S_D2'** |
| CONDITION 3 | OBSERVED DATA **M_B3**,<br>OBSERVED DATA **M_C3**,<br>OBSERVED DATA **M_D3** | MEASURED DATA **I_B3**,<br>MEASURED DATA **I_C3**,<br>MEASURED DATA **I_D3** | SHAPE DATA **S_B3**,<br>SHAPE DATA **S_C3**,<br>SHAPE DATA **S_D3** | SHAPE DATA **S_B3'**,<br>SHAPE DATA **S_C3'**,<br>SHAPE DATA **S_D3'** |
| ⋮ | ⋮ | ⋮ | ⋮ | ⋮ |
| CONDITION x | OBSERVED DATA **M_Bx**,<br>OBSERVED DATA **M_Cx**,<br>OBSERVED DATA **M_Dx** | MEASURED DATA **I_Bx**,<br>MEASURED DATA **I_Cx**,<br>MEASURED DATA **I_Dx** | SHAPE DATA **S_Bx**,<br>SHAPE DATA **S_Cx**,<br>SHAPE DATA **S_Dx** | SHAPE DATA **S_Bx'**,<br>SHAPE DATA **S_Cx'**,<br>SHAPE DATA **S_Dx'** |

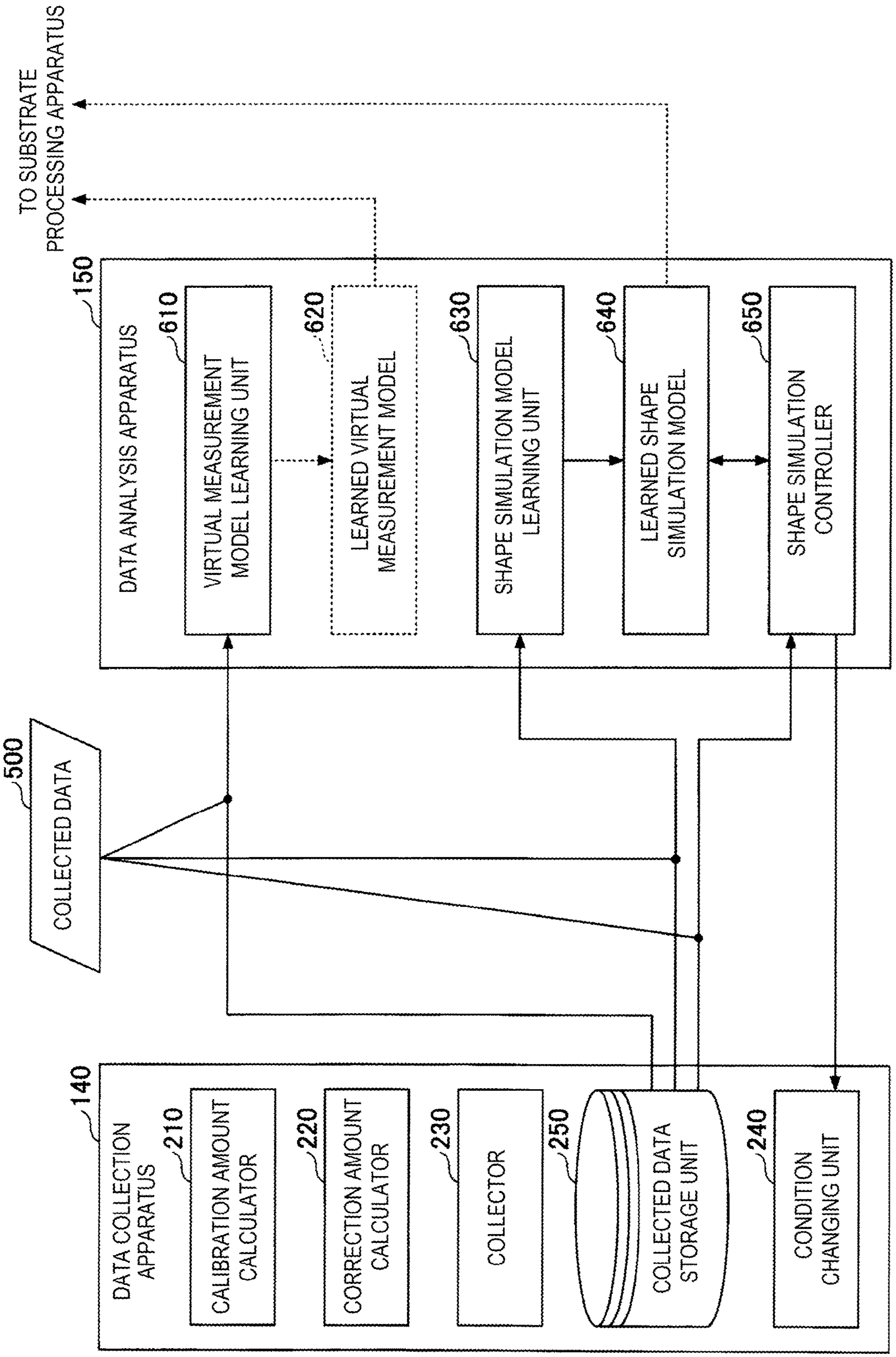

FIG. 6
500
COLLECTED DATA
TO SUBSTRATE PROCESSING APPARATUS
140
DATA COLLECTION APPARATUS
210
CALIBRATION AMOUNT CALCULATOR
220
CORRECTION AMOUNT CALCULATOR
230
COLLECTOR
250
COLLECTED DATA STORAGE UNIT
240
CONDITION CHANGING UNIT
150
DATA ANALYSIS APPARATUS
610
VIRTUAL MEASUREMENT MODEL LEARNING UNIT
620
LEARNED VIRTUAL MEASUREMENT MODEL
630
SHAPE SIMULATION MODEL LEARNING UNIT
640
LEARNED SHAPE SIMULATION MODEL
650
SHAPE SIMULATION CONTROLLER

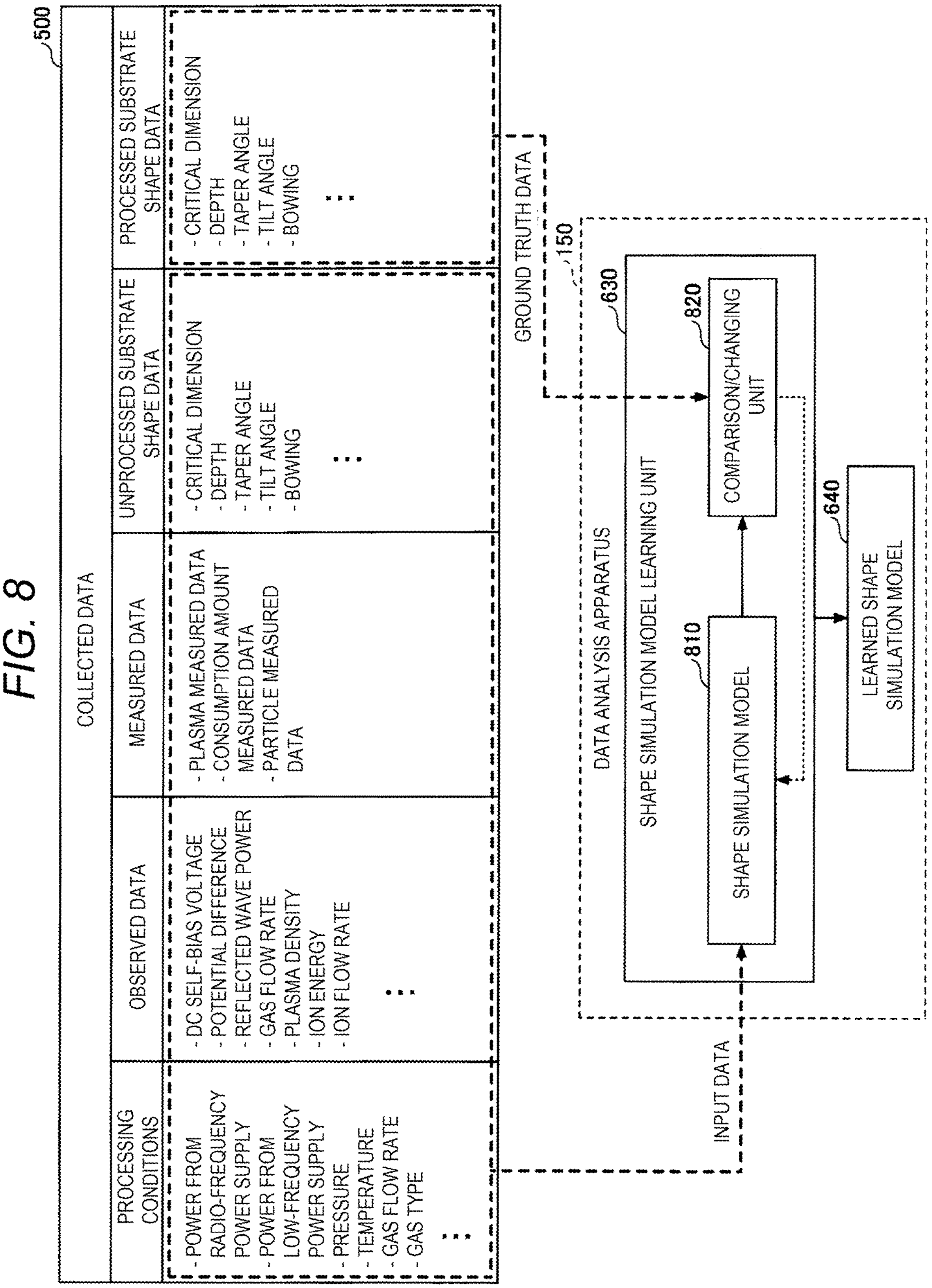

FIG. 8
500
COLLECTED DATA
PROCESSING CONDITIONS
- POWER FROM RADIO-FREQUENCY POWER SUPPLY
- POWER FROM LOW-FREQUENCY POWER SUPPLY
- PRESSURE
- TEMPERATURE
- GAS FLOW RATE
- GAS TYPE
OBSERVED DATA
- DC SELF-BIAS VOLTAGE
- POTENTIAL DIFFERENCE
- REFLECTED WAVE POWER
- GAS FLOW RATE
- PLASMA DENSITY
- ION ENERGY
- ION FLOW RATE
MEASURED DATA
- PLASMA MEASURED DATA
- CONSUMPTION AMOUNT MEASURED DATA
- PARTICLE MEASURED DATA
UNPROCESSED SUBSTRATE SHAPE DATA
- CRITICAL DIMENSION
- DEPTH
- TAPER ANGLE
- TILT ANGLE
- BOWING
PROCESSED SUBSTRATE SHAPE DATA
- CRITICAL DIMENSION
- DEPTH
- TAPER ANGLE
- TILT ANGLE
- BOWING
GROUND TRUTH DATA
150
DATA ANALYSIS APPARATUS
630
SHAPE SIMULATION MODEL LEARNING UNIT
INPUT DATA
810
SHAPE SIMULATION MODEL
820
COMPARISON/CHANGING UNIT
640
LEARNED SHAPE SIMULATION MODEL

| COLLECTED DATA | | | | |
|---|---|---|---|---|
| PROCESSING CONDITIONS | OBSERVED DATA | MEASURED DATA | UNPROCESSED SUBSTRATE SHAPE DATA | PROCESSED SUBSTRATE SHAPE DATA |
| CONDITION 2 | OBSERVED DATA M_B2, OBSERVED DATA M_C2, OBSERVED DATA M_D2 | MEASURED DATA I_B2, MEASURED DATA I_C2, MEASURED DATA I_D2 | SHAPE DATA S_B2, SHAPE DATA S_C2, SHAPE DATA S_D2 | SHAPE DATA S_B2', SHAPE DATA S_C2', SHAPE DATA S_D2' |
| CONDITION 3 | OBSERVED DATA M_B3, OBSERVED DATA M_C3, OBSERVED DATA M_D3 | MEASURED DATA I_B3, MEASURED DATA I_C3, MEASURED DATA I_D3 | SHAPE DATA S_B3, SHAPE DATA S_C3, SHAPE DATA S_D3 | SHAPE DATA S_B3', SHAPE DATA S_C3', SHAPE DATA S_D3' |
| ⋮ | ⋮ | ⋮ | ⋮ | ⋮ |
| CONDITION x | OBSERVED DATA M_Bx, OBSERVED DATA M_Cx, OBSERVED DATA M_Dx | MEASURED DATA I_Bx, MEASURED DATA I_Cx, MEASURED DATA I_Dx | SHAPE DATA S_Bx, SHAPE DATA S_Cx, SHAPE DATA S_Dx | SHAPE DATA S_Bx', SHAPE DATA S_Cx', SHAPE DATA S_Dx' |

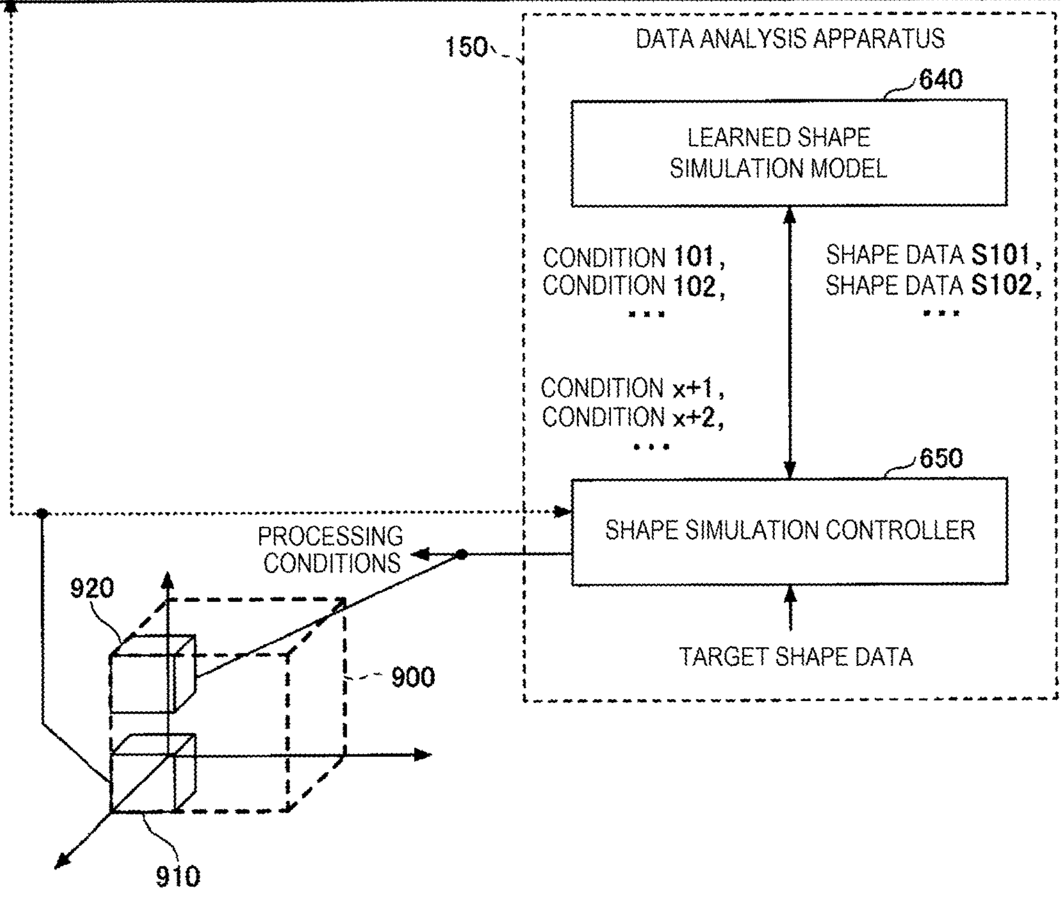

CONDITION x

110

SUBSTRATE PROCESSING APPARATUS (REFERENCE SUBSTRATE PROCESSING APPARATUS)

620

LEARNED VIRTUAL MEASUREMENT MODEL

640

LEARNED SHAPE SIMULATION MODEL

UNPROCESSED SUBSTRATE

PROCESSED SUBSTRATE

SHAPE DATA $S_\alpha x$

SHAPE DATA $S_\alpha x'$

OBSERVED DATA $M_\alpha x$

MEASURED DATA $I_\alpha x$

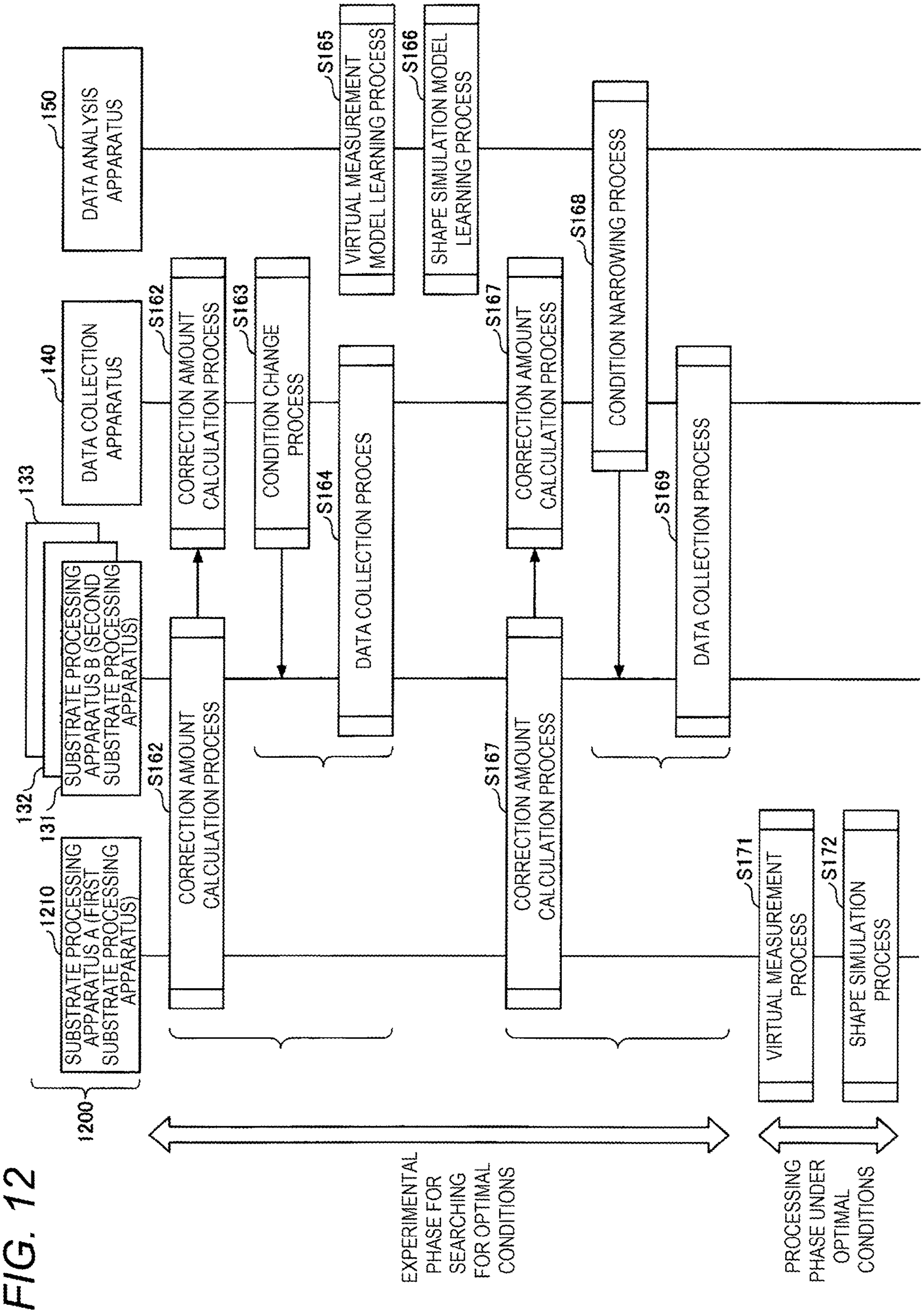

FIG. 12
1200
1210
SUBSTRATE PROCESSING APPARATUS A (FIRST SUBSTRATE PROCESSING APPARATUS)
131
132
133
SUBSTRATE PROCESSING APPARATUS B (SECOND SUBSTRATE PROCESSING APPARATUS)
140
DATA COLLECTION APPARATUS
150
DATA ANALYSIS APPARATUS
S162
CORRECTION AMOUNT CALCULATION PROCESS
S162
CORRECTION AMOUNT CALCULATION PROCESS
S163
CONDITION CHANGE PROCESS
S164
DATA COLLECTION PROCES
S165
VIRTUAL MEASUREMENT MODEL LEARNING PROCESS
S166
SHAPE SIMULATION MODEL LEARNING PROCESS
S167
CORRECTION AMOUNT CALCULATION PROCESS
S167
CORRECTION AMOUNT CALCULATION PROCESS
S168
CONDITION NARROWING PROCESS
S169
DATA COLLECTION PROCESS
EXPERIMENTAL PHASE FOR SEARCHING FOR OPTIMAL CONDITIONS
S171
VIRTUAL MEASUREMENT PROCESS
S172
SHAPE SIMULATION PROCESS
PROCESSING PHASE UNDER OPTIMAL CONDITIONS

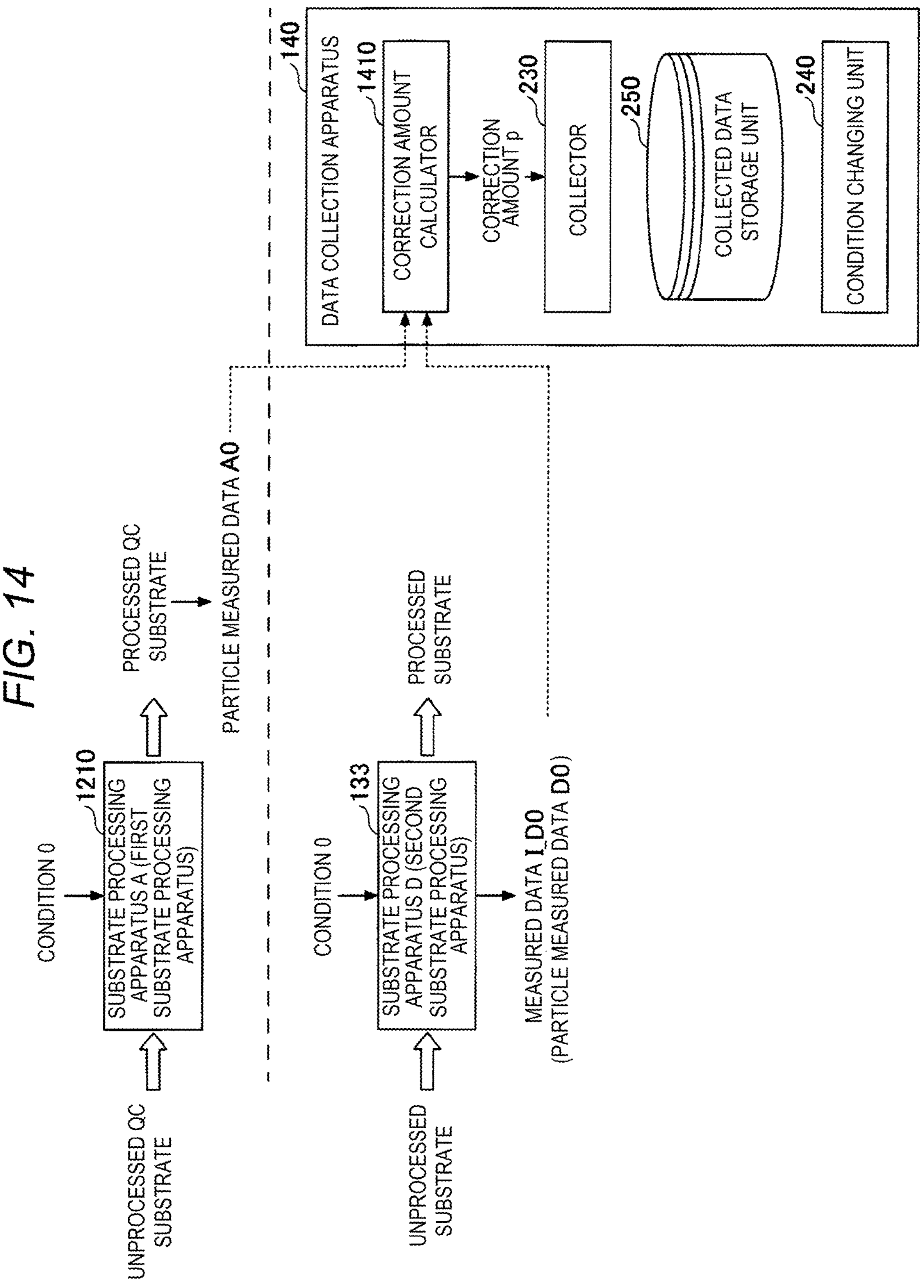

FIG. 14
CONDITION 0
UNPROCESSED QC SUBSTRATE
1210
SUBSTRATE PROCESSING APPARATUS A (FIRST SUBSTRATE PROCESSING APPARATUS)
PROCESSED QC SUBSTRATE
PARTICLE MEASURED DATA A0
CONDITION 0
UNPROCESSED SUBSTRATE
133
SUBSTRATE PROCESSING APPARATUS D (SECOND SUBSTRATE PROCESSING APPARATUS)
PROCESSED SUBSTRATE
MEASURED DATA I_D0 (PARTICLE MEASURED DATA D0)
140
DATA COLLECTION APPARATUS
1410
CORRECTION AMOUNT CALCULATOR
CORRECTION AMOUNT p
230
COLLECTOR
250
COLLECTED DATA STORAGE UNIT
240
CONDITION CHANGING UNIT

DATA COLLECTION SYSTEM, DATA COLLECTION APPARATUS, DATA COLLECTION METHOD, AND DATA COLLECTION PROGRAM

CROSS-REFERENCE TO RELATED APPLICATIONS

This application is a continuation application of International Application No. PCT/JP2022/006954 filed on Feb. 21, 2022, and designating the U.S., which is based upon and claims priority to Japanese Patent Application No. 2021-032890, filed on Mar. 2, 2021, the entire contents of which are incorporated herein by reference.

TECHNICAL FIELD

The present disclosure relates to a data collection system, a data collection apparatus, a data collection method, and a data collection program.

BACKGROUND

In the field of substrate processing apparatuses, for example, the optimal processing conditions are searched for by repeating experiments while changing processing conditions such that a processed substrate shape obtained after processing the substrate matches a target substrate shape.

PRIOR ART DOCUMENTS

Patent Documents

Patent Document 1: Japanese Laid-Open Patent Application Publication No. 2008-034877

Patent Document 2: Japanese Laid-Open Patent Application Publication No. 2019-207951

SUMMARY

A data collection system according to an embodiment of the present disclosure has, for example, the following configuration. That is, a data collection system includes:

a first substrate processing apparatus having a first processing space, a second substrate processing apparatus having a second processing space different from the first processing space, and a data collection apparatus connected to the first substrate processing apparatus and the second substrate processing apparatus, in which the data collection apparatus is configured to:

compare observed data observed when substrates having the same or similar shapes are processed under the same processing conditions in the first processing space and the second processing space, respectively, and calculate a correction amount for correcting the observed data observed when being processed in the second processing space, and correct the observed data observed when being processed in the second processing space based on the correction amount, and collect corrected observed data, when searching for a processing condition by processing substrates while changing the processing condition in the second processing space.

BRIEF DESCRIPTION OF DRAWINGS

FIG. 1 is a diagram illustrating an outline of a configuration and processing of a data collection system according to a first embodiment;

FIG. 3 is a diagram illustrating a specific example of a correction amount calculation process executed by the data collection system according to the first embodiment;

FIG. 4 is a diagram illustrating a specific example of a data collection process and a condition change process executed by the data collection system according to the first embodiment;

FIG. 5 is a diagram illustrating an example of the collected data;

FIG. 6 is a diagram illustrating a specific example of a virtual measurement model learning process, a shape simulation model learning process, and a condition narrowing process executed by the data collection system according to the first embodiment;

FIG. 8 is a diagram illustrating a detailed specific example of the shape simulation model learning process;

FIG. 9 is a diagram illustrating a detailed specific example of the condition narrowing process;

FIG. 12 is a diagram illustrating an outline of a configuration and processing of a data collection system according to a second embodiment;

FIG. 14 is a diagram illustrating a specific example of a correction amount calculation process executed by a data collection system according to a third embodiment.

DETAILED DESCRIPTION

Figure 2:
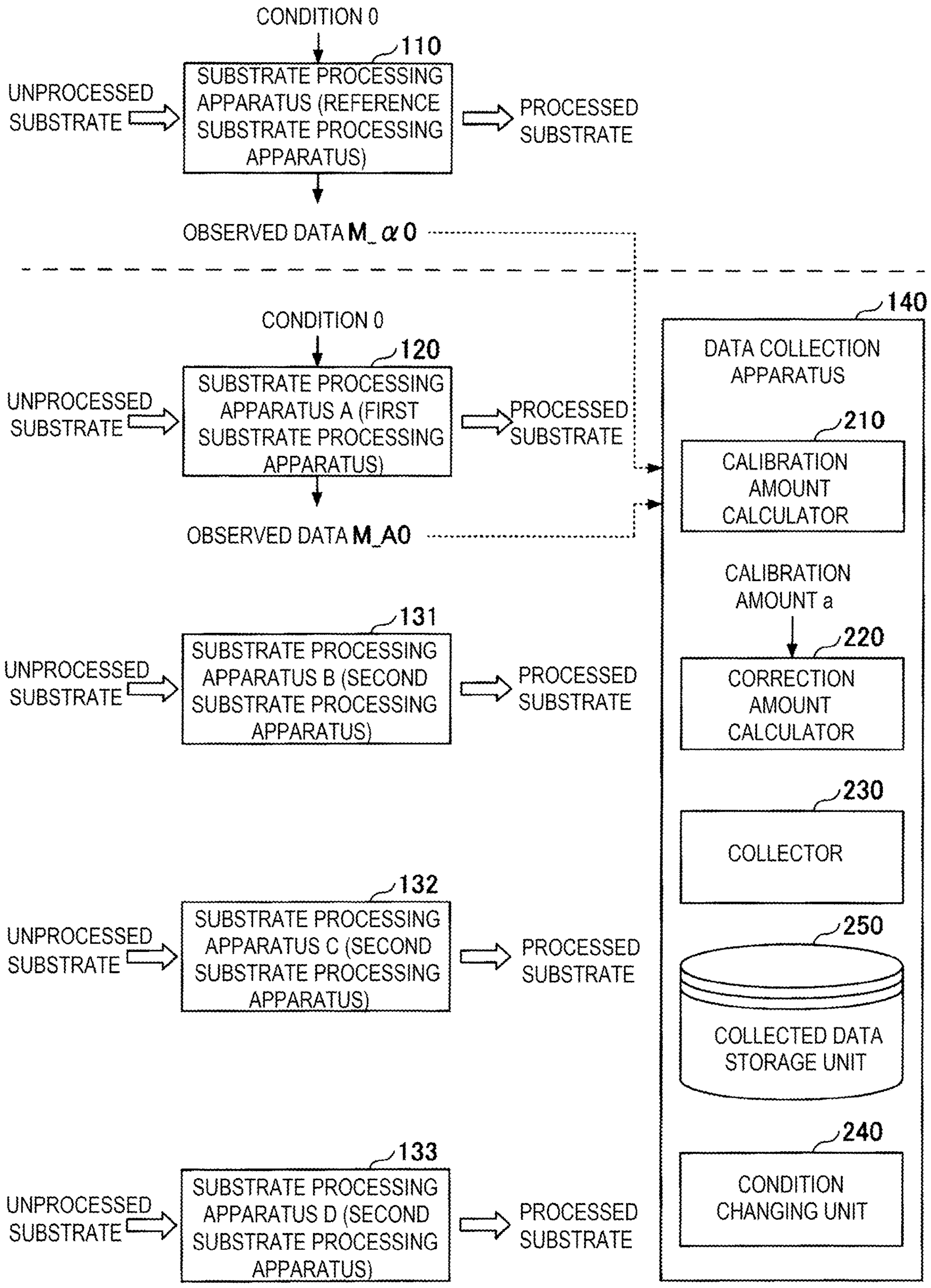
FIG. 2 is a diagram illustrating a specific example of a calibration amount calculation process executed by the data collection system according to the first embodiment.

With the current substrate processing apparatuses, it is difficult to collect detailed data indicative of a state inside a processing space. Therefore, it is difficult to predict how to change the processing conditions to approach the target substrate shape. Therefore, in order to efficiently search for the optimal processing conditions, it is desired to collect detailed data indicative of the state inside the processing space.

Further, for example, if the optimal processing conditions found by using an experimental substrate processing apparatus are applied to a mass-produced substrate processing apparatus, the target substrate shape may not be obtained in the mass-produced apparatus due to the difference between the experimental substrate processing apparatus and the mass-produced substrate processing apparatus. Moreover, in such a case, further experiments are required. Therefore, in order to efficiently search for the optimal processing conditions, it is desired to collect data equivalent to that of a mass-produced apparatus at the time of an experiment.

A data collection system, a data collection apparatus, a data collection method, and a data collection program for collecting appropriate data in the search for processing conditions in substrate processing can be provided.

In the following, embodiments of the present invention will be described with reference to the accompanying drawings. In the specification and drawings, elements having substantially the same functions are referred to by the same numerals, and a duplicate description thereof will be omitted.

First Embodiment

<Outline of Configuration and Processing of Data Collection System>

First, an outline of a configuration of a data collection system according to a first embodiment and processing executed by the data collection system according to the first embodiment will be described. FIG. 1 is a diagram illustrating the outline of the configuration and the processing of the data collection system according to the first embodiment.

As illustrated in FIG. 1, the data collection system 100 includes:

- a substrate processing apparatus 110, which is an example of a reference substrate processing apparatus;
- a substrate processing apparatus A 120, which is an example of a first substrate processing apparatus;
- a substrate processing apparatus B 131, a substrate processing apparatus C 132, and a substrate processing apparatus D 133, which are examples of a second substrate processing apparatus;
- a data collection apparatus 140; and
- a data analysis apparatus 150.

The data collection system 100 is used in, for example, scenes where a substrate processing apparatus manufacturer supports a substrate manufacturer so that substrates having a target substrate shape can be mass-produced by the substrate manufacturer.

The substrate processing apparatus 110 is, for example, what is called a mass-produced apparatus installed in a substrate manufacturer. The substrate processing apparatus 110 has a reference chamber that is an example of a reference processing space, and processes substrates under predetermined processing conditions. The substrate processing apparatus 110 is provided with various observation sensors to output observed data observed by the various observation sensors during the processing of the substrate.

The substrate processing apparatus A 120 is installed in, for example, the substrate processing apparatus manufacturer (similarly with the mass-produced apparatus). The substrate processing apparatus A 120 has a first chamber, which is an example of a first processing space identical to the reference processing space, and processes substrates under predetermined processing conditions. The substrate processing apparatus A 120 is provided with various observation sensors to output observed data observed by the various observation sensors during the processing of the substrate.

The substrate processing apparatus B 131 is, for example, what is called an experimental apparatus installed in the substrate processing apparatus manufacturer. The substrate processing apparatus B 131 has a second chamber, which is an example of a second processing space identical to the reference processing space, and processes substrates under predetermined processing conditions. The substrate processing apparatus B 131 is provided with various observation sensors to output observed data observed by the various observation sensors during the processing of the substrate. Further, a plasma probe is additionally provided inside the second chamber, and plasma measured data detected by the plasma probe during the processing of the substrate is output.

The substrate processing apparatus C 132 is installed in, for example, the substrate processing apparatus manufacturer (an experimental apparatus). The substrate processing apparatus C 132 has a third chamber, which is an example of a second processing space identical to the reference processing space, and processes substrates under predetermined processing conditions. The substrate processing apparatus C 132 is provided with various observation sensors to output observed data observed by the various observation sensors during the processing of the substrate. Further, a consumption amount sensor is additionally provided inside the third chamber, and consumption amount measured data indicative of the consumption amount of the components in the third chamber measured by the consumption amount sensor during the processing of the substrate is output.

The substrate processing apparatus D 133 is installed in, for example, the substrate processing apparatus manufacturer (an experimental apparatus). The substrate processing apparatus D 133 has a fourth chamber, which is an example of a second processing space identical to the reference processing space, and processes substrates under predetermined processing conditions. The substrate processing apparatus D 133 is provided with various observation sensors to output observed data observed by the various observation sensors during the processing of the substrate. Further, a particle sensor is additionally provided inside the fourth chamber, and particle measured data indicative of particles in the fourth chamber detected by the particle sensor during the processing of the substrate is output.

Although not illustrated in FIG. 1, the data collection system 100 includes a shape measurement apparatus for measuring the substrate shapes of unprocessed substrates and processed substrates, and is configured to output the measured shape data.

The data collection apparatus 140 is installed in, for example, the substrate processing apparatus manufacturer. The data collection apparatus 140 is connected to substrate processing apparatuses including the substrate processing apparatus 110, the substrate processing apparatus A 120, the substrate processing apparatus B 131 to the substrate processing apparatus D 133, and a shape measurement apparatus (not illustrated).

Thereby, the data collection apparatus 140 collects the processing conditions used by each substrate processing apparatus to process the substrates, and the observed data observed by the various observation sensors during the processing of the substrates by each substrate processing apparatus.

Further, the data collection apparatus 140 collects the shape data measured with respect to unprocessed substrates and processed substrates processed by the substrate processing apparatuses.

Further, the data collection apparatus 140 collects the plasma measured data, the consumption amount measured data, and the particle measured data detected by the plasma probe, the consumption amount sensor, and the particle sensor, respectively, during the processing of the substrate by the substrate processing apparatus B 131 to the substrate processing apparatus D 133.

The data analysis apparatus 150 is installed in, for example, the substrate processing apparatus manufacturer. The data analysis apparatus 150 uses the data collected by the data collection apparatus 140 (referred to as collected data) to perform a learning process with respect to various models (i.e., train various models).

Hereinafter, the outline of the process executed by the data collection system 100 (i.e., the process executed by each apparatus constituting the data collection system 100 alone or a plurality of apparatuses in cooperation) will be described. As illustrated in FIG. 1, the processing executed by the data collection system 100 can be roughly divided into:

"experimental phase for searching for optimal conditions"; and

"processing phase under optimal conditions".

The experimental phase for searching for the optimal conditions is a phase for searching for the optimal processing conditions for achieving the target substrate shape. Further, the processing phase under the optimal conditions is a phase of processing the substrate under the found optimal processing conditions. Hereinafter, the outline of the processing in each phase will be described.

(1) Experimental Phase for Searching for Optimal Conditions

In step S161, the substrate processing apparatus 110, the substrate processing apparatus A 120, and the data collection apparatus 140 perform a calibration amount calculation process.

Specifically, the substrate processing apparatus 110 and the substrate processing apparatus A 120 process substrates having the same or similar shapes under the same processing conditions, so that the data collection apparatus 140 collects observed data observed by the respective observation sensors.

The data collection apparatus 140 also calculates a calibration amount for calibrating the differences in the observed data based on "machine differences" between the substrate processing apparatus 110 and the substrate processing apparatus A 120.

The data collection apparatus 140 then calibrates the observed data output from the substrate processing apparatus A 120 based on the calculated calibration amount. Thereby, the data collection apparatus 140 can collect, from the substrate processing apparatus A 120, observed data the same as the observed data output when the substrates having the same or similar shapes are processed in the substrate processing apparatus 110 under the same processing conditions.

In step S162, the substrate processing apparatus A 120, the substrate processing apparatus B 131 to the substrate processing apparatus D 133, and the data collection apparatus 140 perform a correction amount calculation process. Specifically, the substrate processing apparatus A 120 and the substrate processing apparatus B 131 to the substrate processing apparatus D 133 process substrates having the same or similar shapes under the same processing conditions, so that the data collection apparatus 140 collects observed data observed by the respective observation sensors.

Further, the data collection apparatus 140 calculates the difference between the various observed data collected from the substrate processing apparatus A 120 and the substrate processing apparatus B 131, thereby calculating a correction amount for correcting the influence of the disturbance caused by the plasma probe being provided in the second chamber.

The data collection apparatus 140 then corrects the observed data output from the substrate processing apparatus B 131 based on the calculated correction amount. Thereby, the data collection apparatus 140 can collect, from the substrate processing apparatus B 131, observed data the same as the observed data collected when the substrates having the same or similar shapes are processed in the substrate processing apparatus A 120 under the same processing conditions.

Similarly, the data collection apparatus 140 calculates the difference between the various observed data collected from the substrate processing apparatus A 120 and the substrate processing apparatus C 132, thereby calculating a correction amount for correcting the influence of the disturbance caused by the consumption amount sensor being provided in the third chamber.

The data collection apparatus 140 then corrects the observed data output from the substrate processing apparatus C 132 based on the calculated correction amount. Thereby, the data collection apparatus 140 can collect, from the substrate processing apparatus C 132, observed data the same as the observed data collected when the substrates having the same or similar shapes are processed in the substrate processing apparatus A 120 under the same processing conditions.

Similarly, the data collection apparatus 140 calculates the difference between the various observed data collected from the substrate processing apparatus A 120 and the substrate processing apparatus D 133, thereby calculating a correction amount for correcting the influence of the disturbance caused by the particle sensor being provided in the fourth chamber.

The data collection apparatus 140 then corrects the observed data output from the substrate processing apparatus D 133 based on the calculated correction amount. Thereby, the data collection apparatus 140 can collect, from the substrate processing apparatus D 133, observed data the same as the observed data collected when the substrates having the same or similar shapes are processed in the substrate processing apparatus A 120 under the same processing conditions.

In step S163, in order to search for the optimal processing conditions for achieving the target substrate shape, the data collection apparatus 140 changes the processing conditions used by the substrate processing apparatus B 131 to the substrate processing apparatus D 133 to process substrates. The data collection apparatus 140 sets the changed processing conditions in the substrate processing apparatus B 131 to the substrate processing apparatus D 133.

In step S164, the substrate processing apparatus B 131 to the substrate processing apparatus D 133 and the data collection apparatus 140 perform a data collection process.

Specifically, the substrate processing apparatus B 131 to the substrate processing apparatus D 133 process substrates having the same or similar shapes under the changed processing conditions, and output various observed data, plasma measured data, consumption amount measured data, and particle measured data. Further, the shape measurement apparatus (not illustrated) outputs shape data of the unprocessed substrates and shape data of the processed substrates.

The data collection apparatus 140 corrects various observed data using the correction amount, and collects various corrected observed data. The data collection apparatus 140 collects the plasma measured data output from the substrate processing apparatus B 131, the consumption amount measured data output from the substrate processing apparatus C 132, and the particle measured data output from the substrate processing apparatus D 133 (these data will be referred to as "various measured data"). The data collection apparatus 140 collects the shape data of the unprocessed substrates and the shape data of the processed substrates (these data will be referred to as "various shape data"), which are output from the shape measurement apparatus (not illustrated).

The data collection apparatus 140 displays the collected data (i.e., the previous processing conditions, the various observed data, the various measured data, and the various shape data) to the experimenter. Thereby, the experimenter can observe not only the various observed data but also the various shape data with reference to the various measured data, which is detailed data representing the state inside the chamber. As a result, the experimenter can set the next processing conditions to processing conditions more appropriate for approaching the target substrate shape, and can efficiently search for the optimal processing conditions.

The condition change process of step S163 and the data collection process of step S164 are executed repeatedly. The correction amount calculation process of step S162 is executed after a predetermined number of repetitions. This is because the various measured data output from the substrate processing apparatus B 131 to the substrate processing apparatus D 133 change over time. The influence of the disturbance can be constantly eliminated by periodically updating the correction amount.

By performing the calibration amount calculation process (step S161) and the correction amount calculation process (step S162) in this manner, in the search for optimal processing conditions, the data collection apparatus 140 can collect, from the substrate processing apparatus B 131 to the substrate processing apparatus D 133, observed data in which the influences:

the influence of machine differences; and the influence of disturbances are eliminated (observed data equivalent to the observed data output from the mass-produced substrate processing apparatus 110).

When a predetermined amount of data is collected through the repetition of the condition change process of step S163 and the data collection process of step S164, in step S165, the data analysis apparatus 150 uses the collected data to perform a learning process with respect to a virtual measurement model. The virtual measurement model is a model for predicting various measurement data during substrate processing (i.e., the plasma measured data, the consumption amount measured data, and the particle measured data), based on various observed data.

The data analysis apparatus 150 performs the learning process using the various observed data as input data and using the various measured data as ground truth data. Thereby, the data analysis apparatus 150 can generate a learned virtual measurement model.

The generated learned virtual measurement model is installed in, for example, the substrate processing apparatus 110 without being provided with a plasma probe, a consumption amount sensor or a particle sensor.

Thereby, the substrate processing apparatus 110 can predict, and display to the operator or the like, plasma measured data, consumption amount measured data, and particle measured data based on various observed data when processing substrates in the "processing phase under optimal conditions".

In step S166, the data analysis apparatus 150 uses the collected data to perform a learning process with respect to a shape simulation model. The shape simulation model is a model for predicting shape data of a processed substrate when a substrate is processed.

The data analysis apparatus 150 performs the learning process using, as input data, the various observed data, the various measured data, the processing conditions, and the shape data of the unprocessed substrate, and using, as ground truth data, the shape data of the processed substrate. Thereby, the data analysis apparatus 150 generates a learned shape simulation model.

In this way, by performing the learning process while including, in the input data, not only various observed data but also various measured data, a learned shape simulation model with high prediction accuracy can be generated.

The generated learned shape simulation model is installed in, for example, the substrate processing apparatus 110. Thereby, in the substrate processing apparatus 110, the shape data of the processed substrate after the substrate is processed in the "processing phase under optimal conditions" can be predicted.

At this point in time (the point in time when step S166 is completed), if the target substrate shape has not been reached (when the difference from the target substrate shape is equal to or more than a predetermined threshold value), the search for the optimal processing conditions is continued while changing the processing conditions.

Specifically, in step S167, the substrate processing apparatus A 120, the substrate processing apparatus B 131 to the substrate processing apparatus D 133, and the data collection apparatus 140 perform the correction amount calculation process. Since the correction amount calculation process in step S167 is the same as the correction amount calculation process in step S162, descriptions thereof will be omitted.

In step S168, the data collection apparatus 140 and the data analysis apparatus 150 perform a condition narrowing process to narrow the processing conditions using the learned shape simulation model generated in step S166.

Specifically, the data analysis apparatus 150 uses the learned shape simulation model to predict shape data of the processed substrate, thereby narrowing processing conditions for approaching the target substrate shape.

In parallel, in order to improve the prediction accuracy of the learned shape simulation model, the data analysis apparatus 150 narrows processing conditions under which no collected data is obtained.

Thereby, the data analysis apparatus 150 sets the changed processing conditions to the processing conditions narrowed from the viewpoint of searching for the optimal processing conditions, or to the processing conditions narrowed from the viewpoint of improving the prediction accuracy, in the substrate processing apparatus B 131 to the substrate processing apparatus D 133.

In step S169, the substrate processing apparatus B 131 to the substrate processing apparatus D 133 and the data collection apparatus 140 perform the data collection process. Since the data collection processing in step S169 is the same as the data collection processing in step S164, descriptions thereof will be omitted.

The condition narrowing process of step S168 and the data collection process of step S169 are also repeatedly executed, similarly to the condition change process of step S163 and the data collection process of step S164. However, unlike the cases of step S163 and step S164, since the processing conditions are properly narrowed in step S168, the speed for approaching the optimal processing conditions is accelerated (i.e., the optimal processing conditions can be found more efficiently).

Similar to step S162, if the processing of the substrate under the changed processing conditions is to be repeated a predetermined number of times, the correction amount calculation process of step S167 is executed to correct the influence of the change over time in the various observed data output to the substrate processing apparatus B 131 to the substrate processing apparatus D 133.

In this way, when the target substrate shape is reached (when the error with respect to the target substrate shape is less than the predetermined threshold value) by repeating the processing of the substrate while changing the processing conditions, the processing conditions at the point in time when the target substrate shape is reached are determined as the optimal processing conditions. Thereby, the experimental phase for searching for optimal conditions is completed.

When the experimental phase for searching for optimal conditions is completed, the procedure shifts to the "processing phase under optimal conditions". In the processing phase under optimal conditions, the substrate is processed under the optimal processing conditions using the substrate processing apparatus 110 on which the learned virtual measurement model and the learned shape simulation model generated in the experimental phase for searching for optimal conditions are installed.

Further, as illustrated in FIG. 1, in step S171, the substrate processing apparatus 110 performs a virtual measurement process when processing substrates under the optimal processing conditions. As a result, various observed data observed during the processing of the substrate are input to the learned virtual measurement model to predict various measurement data (i.e., the plasma measured data, the consumption amount measured data, and the particle measured data). Further, the predicted various measurement data is displayed to the operator or the like.

Thereby, the operator or the like can monitor the plasma measured data, the consumption amount measured data, and the particle measured data, which cannot be monitored in the related art when processing the substrate.

In step S172, the substrate processing apparatus 110 performs a shape simulation process when the substrate is processed under the optimal processing conditions. Thereby, the various observed data observed during the processing of the substrate, the various measurement data that are predicted, the processing conditions, and the shape data of the unprocessed substrate are input to the learned shape simulation model. Further, in the learned shape simulation model, the shape data of the processed substrate is predicted, and the predicted shape data is displayed to the operator or the like.

As a result, the operator or the like can determine whether the processed substrates are good or bad without inspecting all the processed substrates.

Specific Example of Process Executed by Data Collection System

Next, a specific example of each process executed by the data collection system 100 will be described.

(1) Specific Example of Calibration Amount Calculation Process (Step S161)

First, a specific example of the calibration amount calculation process (step S161) executed by the data collection system 100 will be described. FIG. 2 is a diagram illustrating a specific example of a calibration amount calculation process executed by the data collection system according to the first embodiment.

The example of FIG. 2 illustrates a state of outputting observed data="observed data M_α0" and "observed data M_A0", respectively, as a result of the substrate processing apparatus 110 and the substrate processing apparatus A 120 processing unprocessed substrates having the same or similar shapes under the processing condition="condition 0".

A data collection program is installed in the data collection apparatus 140. When the program is executed, the data collection apparatus 140 functions as:

a calibration amount calculator 210;

a correction amount calculator 220;

a collector 230; and a condition changing unit 240.

In the calibration amount calculation process (step 161), the data collection apparatus 140 causes the calibration amount calculator 210 to operate to acquire observed data="observed data M_α0" output from the substrate processing apparatus 110. The calibration amount calculator 210 acquires observed data="observed data M_A0" output from the substrate processing apparatus A 120. The calibration amount calculator 210 calculates a calibration amount a for matching the observed data="observed data M_A0" with the observed data="observed data M_α0". The calibration amount calculator 210 notifies the correction amount calculator 220 of the calculated calibration amount a.

(2) Specific Example of Correction Amount Calculation Process (Step S162)

Next, a specific example of the correction amount calculation process (step S162) executed by the data collection system 100 will be described. FIG. 3 is a diagram illustrating a specific example of the correction amount calculation process executed by the data collection system according to the first embodiment.

The example of FIG. 3 illustrates a state of outputting observed data="observed data M_A1" to "observed data M_D1", respectively, as a result of the substrate processing apparatus A 120 and the substrate processing apparatuses B 131 to D 133 processing unprocessed substrates having the same or similar shapes under the processing condition="condition 1".

In the correction amount calculation process (step S162), the data collection apparatus 140 operates as the correction amount calculator 220 to acquire observed data="observed data M_A1" to "observed data M_D1" output from the substrate processing apparatus A 120 and the substrate processing apparatuses B 131 to D 133.

The correction amount calculator 220 calibrates the obtained observed data="observed data M_A1" by using the calibration amount a, and generates calibrated observed data.

The correction amount calculator 220 calculates a correction amount b for matching the observed data="observed data M_B1" with the calibrated observed data, and notifies the collector 230.

Similarly, the correction amount calculator 220 calculates a correction amount c for matching the observed data="observed data M_C1" with the calibrated observed data, and notifies the collector 230.

Similarly, the correction amount calculator 220 calculates a correction amount d for matching the observed data="observed data M_D1" with the calibrated observed data, and notifies the collector 230.

(3) Specific Example of Condition Change Process (step S163) and Data Collection Process (Step S164)

Next, a specific example of the condition change process (step S163) and the data collection process (step S164) executed by the data collection system 100 will be described. FIG. 4 is a diagram illustrating the specific example of the data collection process and the condition change process executed by the data collection system according to the first embodiment.

In the condition change process (step S163), the condition changing unit 240 operates as the data collection apparatus 140. The example of FIG. 4 illustrates a state in which the condition changing unit 240 successively transmits the processing conditions="condition 2", "condition 3", . . . to the substrate processing apparatus B 131, the substrate processing apparatus C 132, and the substrate processing apparatus D 133.

The example of FIG. 4 illustrates a state of outputting:

observed data="observed data M_B2", "observed data M_B3", . . . ; and measured data="measured data I_B2", "measured data I_B3", . . . , respectively, as a result of the substrate processing apparatus B 131 processing unprocessed substrates having the same shape under the processing conditions="condition 2", "condition 3", . . . . Further, the example of FIG. 4 illustrates a state of generating:

processed substrates whose shape data="shape data S_B2'", "shape data S_B3'", . . . from unprocessed substrates whose shape data="shape data S_B2", "shape data S_B3", . . . , as a result of being processed by the substrate processing apparatus B 131.

Similarly, the example of FIG. 4 illustrates a state of outputting:

observed data="observed data M_C2", "observed data M_C3", . . . ; and measured data="measured data I_C2", "measured data I_C3", . . . , respectively, as a result of the substrate processing apparatus C 132 processing unprocessed substrates having the same shape under the processing conditions="condition 2", "condition 3", . . . . Further, the example of FIG. 4 illustrates a state of generating:

processed substrates whose shape data="shape data S_C2'", "shape data S_C3'", . . . from unprocessed substrates whose shape data="shape data S_C2", "shape data S_C3", . . .

as a result of being processed by the substrate processing apparatus C 132.

Similarly, the example of FIG. 4 illustrates a state of outputting:

observed data="observed data M_D2", "observed data M_D3", . . . ; and measured data="measured data I_D2", "measured data I_D3", . . . , respectively, as a result of the substrate processing apparatus D 133 processing unprocessed substrates having the same shape under the processing conditions="condition 2", "condition 3", . . . . Further, the example of FIG. 4 illustrates a state of generating:

processed substrates whose shape data="shape data S_D2'", "shape data S_D3'", . . . from unprocessed substrates whose shape data="shape data S_D2", "shape data S_D3", . . . , as a result of being processed by the substrate processing apparatus D 133.

In the data collection process (step S164), the collector 230 operates as the data collection apparatus 140. As illustrated in FIG. 4, the collector 230 includes storage units 401, 403, and 405, and correction storage units 402, 404, and 406.

The example of FIG. 4 illustrates a state in which the storage unit 401 stores in the collected data storage unit 250:

the shape data of the unprocessed substrates="shape data S_B2", "shape data S_B3", . . . ; and the shape data of the processed substrates="shape data S_B2'", "shape data S_B3'", . . . .

The example of FIG. 4 illustrates a state in which the correction storage unit 402 corrects the observed data="observed data M_B2", "observed data M_B3", . . . by using the correction amount b, and stores the corrected observed data in the collected data storage unit 250. The correction storage unit 402 stores measured data="measured data I_B2", "measured data I_B3", . . . in the collected data storage unit 250.

Similarly, the example of FIG. 4 illustrates a state in which the storage unit 403 stores in the collected data storage unit 250:

the shape data of the unprocessed substrates="shape data S_C2", "shape data S_C3", . . . ; and the shape data of the processed substrates="shape data S_C2'", "shape data S_C3'", . . . .

The example of FIG. 4 illustrates a state in which the correction storage unit 404 corrects the observed data="observed data M_C2", "observed data M_C3", . . . by using the correction amount c, and stores the corrected observed data in the collected data storage unit 250. The correction storage unit 404 stores measured data="measured data I_C2", "measured data I_C3", . . . in the collected data storage unit 250.

Similarly, the example of FIG. 4 illustrates a state in which the storage unit 405 stores in the collected data storage unit 250:

the shape data of the unprocessed substrates="shape data S_D2", "shape data S_D3", . . . ; and the shape data of the processed substrates="shape data S_D2'", "shape data S_D3'", . . . .

The example of FIG. 4 illustrates a state in which the correction storage unit 406 corrects the observed data="observed data M_D2", "observed data M_D3", . . . by using the correction amount d, and stores the corrected observed data in the collected data storage unit 250. The correction storage unit 406 stores measured data="measured data I_D2", "measured data I_D3", . . . in the collected data storage unit 250.

In the following, the collected data stored in the collected data storage unit 250 will be described. FIG. 5 is a diagram illustrating an example of the collected data.

As illustrated in FIG. 5, collected data 500 includes, as information items, "processing conditions", "observed data", "measured data", "unprocessed substrate shape data", and "processed substrate shape data".

The "processing conditions" stores set values of, for example, the power of the radio-frequency power supply, the power of the low-frequency power supply, the pressure in the chamber, the temperature in the chamber, the gas flow rate, and the gas type. The processing conditions="condition 2", "condition 3", . . . "condition x" include combinations in which at least one of these set values is different.

The "observed data" stores, for example, observed values of the direct-current self-bias voltage, the potential difference, the reflected wave power, the gas flow rate, the plasma density, the ion energy, the ion flow rate, and the like. The observed data="observed data M_B1", "observed data M_C1", and "observed data M_D1" each include a combination of these observed values.

The "measured data" stores measured values of the additionally provided sensors, such as the plasma measured data, the consumption amount measured data, and the particle measured data. Specifically, the measured data="measured data I_B1" includes the measured value of the plasma measured data. The measured data="measured data I_C1" includes the measured value of the consumption amount measured data. The measured data="measured data I_D1" includes the measured value of the particle measured data.

The "unprocessed substrate shape data" stores shape values such as the critical dimension, the depth, the taper angle, the tilt angle, and the bowing, for example. The unprocessed substrate shape data="shape data S_B2" to "shape data S_D2" each include a combination of these shape values.

The "processed substrate shape data" stores shape values such as critical dimensions, depth, taper angle, tilt angle, and bowing, for example. The processed substrate shape data="shape data S_B2'" to "shape data S_D2'" each include a combination of these shape values.

(4) Specific Example of Virtual Measurement Model Learning Process (Step S165), Shape Simulation Model Learning Process (Step S166), and Condition Narrowing Process (Step S168)

(4-1) Specific Example (Outline)

Next, a specific example (outline) of the virtual measurement model learning process (step S165), the shape simulation model learning process (step S166), and the condition narrowing process (step S168) executed by the data collection system 100 will be described.

FIG. 6 is a diagram illustrating a specific example of the virtual measurement model learning process, the shape simulation model learning process, and the condition narrowing process executed by the data collection system according to the first embodiment.

A data analysis program is installed in the data analysis apparatus 150. When the program is executed, the data analysis apparatus 150 functions as:

- a virtual measurement model learning unit 610;
- a shape simulation model learning unit 630;
- a learned shape simulation model 640; and
- a shape simulation controller 650 (an example of a controller and a determination unit).

In the virtual measurement model learning process (step S165), the data analysis apparatus 150 operates as the virtual measurement model learning unit 610 to read the collected data 500 stored in the collected data storage unit 250. The virtual measurement model learning unit 610 uses the read collected data 500 to perform a learning process with respect to the virtual measurement model.

The learned virtual measurement model 620 generated by the virtual measurement model learning unit 610 performing the learning process on the virtual measurement model is installed in the substrate processing apparatus 110.

Meanwhile, in the shape simulation model learning process (step S166), the data analysis apparatus 150 operates as the shape simulation model learning unit 630 to read the collected data 500 stored in the collected data storage unit 250. The shape simulation model learning unit 630 uses the read collected data 500 to perform a learning process with respect to the shape simulation model.

The learned shape simulation model 640 generated through the learning process performed by the shape simulation model learning unit 630 is installed in the substrate processing apparatus 110. The learned shape simulation model 640 is executed by the shape simulation controller 650 in the condition narrowing process (step S168).

Specifically, in the condition narrowing process (step S168), the data analysis apparatus 150 operates as the shape simulation controller 650. The shape simulation controller 650 executes the learned shape simulation model under various processing conditions to obtain prediction results with respect to the shape data of the processed substrates. The shape simulation controller 650 compares the shape data of the processed substrates, which is the prediction result, with the target substrate shape, thereby narrowing the processing conditions under which the target substrate shape can be achieved. Further, the narrowed processing conditions are notified to the condition changing unit 240 of the data collection apparatus 140. Thereby, the condition changing unit 240 can set, as the changed processing conditions, the processing conditions narrowed from the viewpoint of searching for the optimal processing conditions, in the substrate processing apparatus B 131 to the substrate processing apparatus D 133.

The shape simulation controller 650 refers to the collected data 500 stored in the collected data storage unit 250 to determine the processing conditions that are not used for the learning process of the shape simulation model. The shape simulation controller 650 notifies the condition changing unit 240 of the determined processing conditions. Thereby, the condition changing unit 240 sets, as the changed processing conditions, the processing conditions determined by the shape simulation controller 650 in the substrate processing apparatus B 131 to the substrate processing apparatus D 133. As a result, the data collection processing (step S169) is performed in the substrate processing apparatuses B 131 to D 133 and the data collection apparatus 140. The collected data 500 of the collected data storage unit 250 newly stores:

- various observed data;
- various measured data; and
- various shape data (i.e., the unprocessed substrate shape data and the processed substrate shape data) corresponding to the determined processing conditions.

The shape simulation controller 650 uses the determined processing conditions and the newly stored various observed data, various measured data, and various shape data (i.e., the unprocessed substrate shape data and the processed substrate shape data) to perform a relearning process with respect to the learned shape simulation model (i.e., retrain the learned shape simulation model). The shape simulation controller 650 repeatedly executes the determination of the processing conditions and the relearning process a plurality of times. At this time, the shape simulation controller 650 identifies processing conditions with low prediction accuracy, and notifies the condition changing unit 240 of the identified processing conditions with low prediction accuracy (i.e., narrows the processing conditions for performing the relearning process with respect to the learned shape simulation model). Thereby, the condition changing unit 240 can set, as the changed processing conditions, the processing conditions narrowed from the viewpoint of improving the prediction accuracy of the learned shape simulation model 640, in the substrate processing apparatus B 131 to the substrate processing apparatus D 133.

(4-2) Detailed Specific Example (Virtual Measurement Model Learning Process (Step S165))

Figure 7:
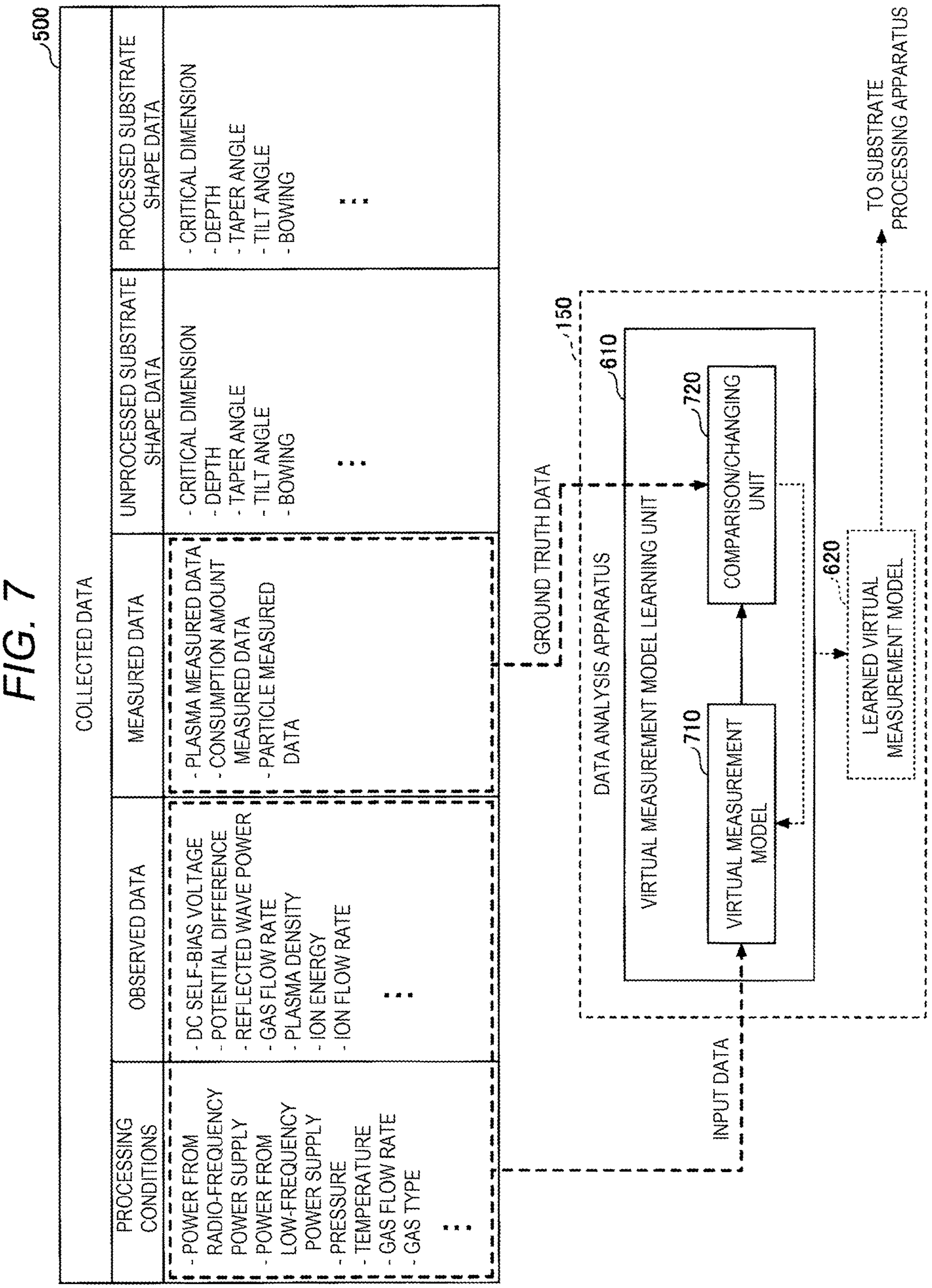
FIG. 7 is a diagram illustrating a detailed specific example of the virtual measurement model learning process.

Next, a detailed specific example of the virtual measurement model learning process (step S165) will be described. FIG. 7 is a diagram illustrating a detailed specific example of the virtual measurement model learning process.

As illustrated in FIG. 7, the virtual measurement model learning unit 610 includes a virtual measurement model 710 and a comparison/changing unit 720.

The set values stored in the "processing conditions" of the collected data 500 and the observed values stored in the "observed data" are input to the virtual measurement model 710 as input data. Thereby, the virtual measurement model 710 outputs output data.

Meanwhile, the measured values stored in the "measured data" of the collected data 500 are input to the comparison/changing unit 720 as ground truth data. The comparison/changing unit 720 compares the output data output from the virtual measurement model 710 with the measured data input as the ground truth data to calculate the error, and updates the model parameters of the virtual measurement model 710 based on the calculated error. Thereby, the virtual measurement model learning unit 610 can generate the learned virtual measurement model 620.

(4-2) Detailed Specific Example (Shape Simulation Model Learning Process (Step S166))

Next, a more detailed specific example of the shape simulation model learning process (step S166) will be described. FIG. 8 is a diagram illustrating a detailed specific example of the shape simulation model learning process.

As illustrated in FIG. 8, the shape simulation model learning unit 630 includes a shape simulation model 810 and a comparison/changing unit 820.

The set values stored in the "processing conditions" of the collected data 500, the observed values stored in the "observed data", the measured values stored in the "measured data", and the shape values stored in the "unprocessed substrate shape data" are input to the shape simulation model 810 as input data. Thereby, the shape simulation model 810 outputs output data.

Meanwhile, the shape values stored in the "processed substrate shape data" of the collected data 500 are input to the comparison/changing unit 820 as ground truth data. The comparison/changing unit 820 compares the output data output from the shape simulation model 810 with the shape values input as the ground truth data to calculate the error, and updates the model parameters of the shape simulation model 810 based on the calculated error. Thereby, the shape simulation model learning unit 630 can generate the learned shape simulation model 640.

(4-3) Details of Specific Example (Details of Condition Narrowing Process (Step S168))

Next, a more detailed specific example of the condition narrowing process (step S168) will be described. FIG. 9 is a diagram illustrating details of the specific example of the condition narrowing process.

As illustrated in the lower right portion of FIG. 9, the shape simulation controller 650 executes the learned shape simulation model under the processing conditions= "condition 101", "condition 102", . . . . Thereby, the shape simulation controller 650 acquires shape data of the processed substrate predicted by the learned shape simulation model 640 ("shape data S101", "shape data S102", . . . ).

Further, the shape simulation controller 650 compares the acquired shape data ("shape data S101", "shape data S102", . . . ) with the shape data of the target substrate shape, thereby narrowing the processing conditions under which the target substrate shape can be achieved. Further, the narrowed processing conditions are notified to the condition changing unit 240 of the data collection apparatus 140.

The example of FIG. 9 illustrates a state in which the processing conditions are narrowed from the viewpoint of searching for the optimal processing conditions, thereby finally finding the processing conditions="condition x" as the optimal processing conditions.

The shape simulation controller 650 refers to the collected data 500 stored in the collected data storage unit 250 to determine the processing conditions that are not used for the learning process of the shape simulation model.

A dashed-line region 900 illustrated in the lower left portion of FIG. 9 schematically illustrates a range in which the processing conditions can be found. Meanwhile, in FIG. 9, a solid-line region 910 schematically represents the range used for the learning process of the shape simulation model (interpolation range).

As described above, the shape simulation controller 650 narrows the processing conditions with low prediction accuracy among the processing conditions that are not used for the learning process of the shape simulation model, from the viewpoint of improving the prediction accuracy of the learned shape simulation model 640.

The example of FIG. 9 illustrates a state in which the shape simulation controller 650 narrows to a solid-line region 920 among the regions other than the solid-line region 910 in the dashed-line region 900.

The example of FIG. 9 illustrates a state in which the shape simulation controller 650 notifies the condition changing unit 240 of "condition x+1", "condition x+2", . . . as the processing conditions included in the solid-line region 920, and inputs these processing conditions into the learned shape simulation model 640.

Thereby, in the learned shape simulation model 640, the relearning process can be performed on the learned shape simulation model 640, using as input data:

the processing conditions="conditions x+1", "conditions x+2", . . . ; and the various observed data, the various measured data, and the unprocessed substrate shape data obtained when the substrate processing apparatus B 131 to the substrate processing apparatus D 133 process substrates under the processing conditions="conditions x+1", "conditions x+2", . . . , and using as ground truth data:

the shape data of the processed substrates obtained when the substrate processing apparatus B 131 to the substrate processing apparatus D 133 process the substrates under the processing conditions="conditions x+1", "conditions x+2", . . . .

(5) Specific Example of Virtual Measurement Process (Step S171) and Shape Simulation Process (Step S172)

Figure 10:
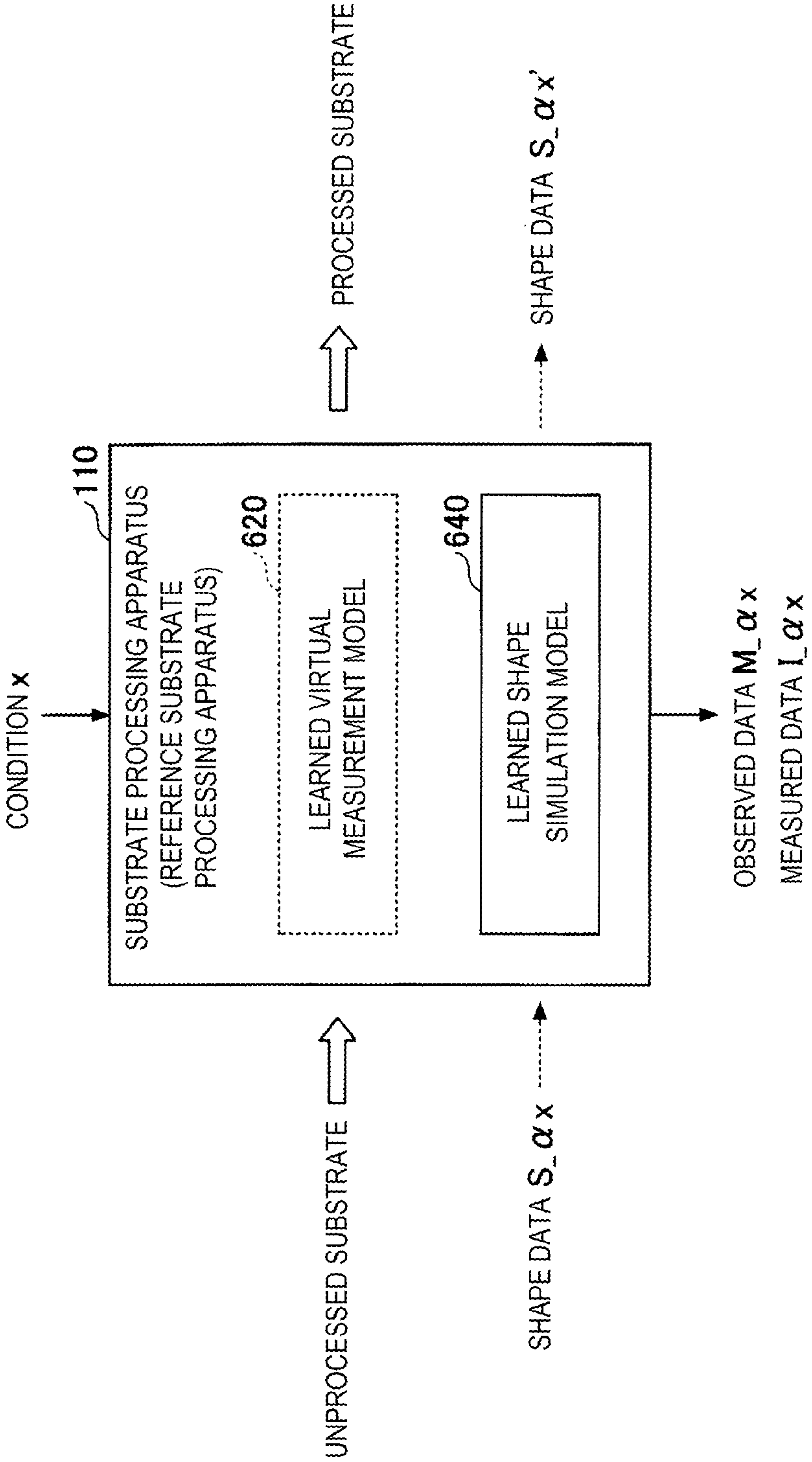
FIG. 10 is a diagram illustrating a specific example of a virtual measurement process and a shape simulation process executed by the data collection system according to the first embodiment.

Next, a specific example of the virtual measurement process (step S171) and the shape simulation process (step S172) executed by the data collection system 100 will be described. FIG. 10 is a diagram illustrating a specific example of a virtual measurement process and a shape simulation process executed by the data collection system according to the first embodiment.

The example of FIG. 10 illustrates a state in which the observed data="observed data M ax" is output when the substrate is processed under the processing condition="condition x". Further, the example of FIG. 10 illustrates a state in which various observed data are input to the learned virtual measurement model 620 to predict the plasma measured data, the consumption amount measured data, and the particle measured data, thereby outputting measured data="measured data I_αx".

By outputting the "measured data I_αx" including the plasma measured data, the consumption amount measured data, and the particle measured data in this manner, the operator or the like can monitor the measured data that cannot be monitored in the related art.

The example of FIG. 10 illustrates a state in which the processing conditions="condition x", the observed data="observed data M_αx", the measured data="measured data I_αx", and the unprocessed substrate shape data="shape data S_αx" are input to the learned shape simulation model 640. Further, the example of FIG. 10 illustrates a state in which the processed substrate shape data="shape data S_αx'" is output from the learned shape simulation model 640.

By predicting the processed substrate shape data in this manner, the operator or the like can determine whether the processed substrates are good or bad without inspecting all the processed substrates.

<Hardware Configuration of Data Collection Apparatus and Data Analysis Apparatus>

Figure 11:
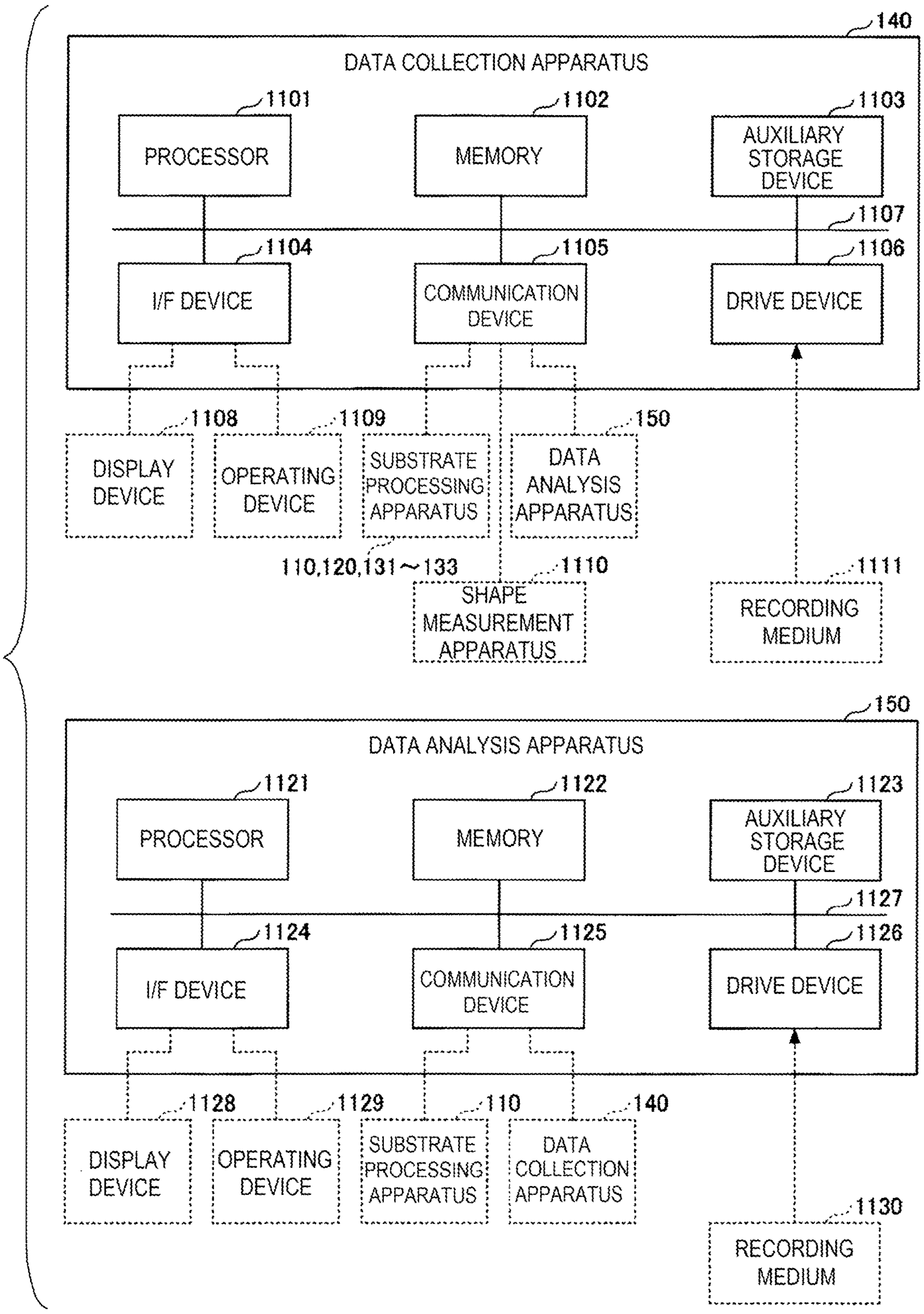
FIG. 11 is a drawing illustrating an example of a hardware configuration of a data collection apparatus and a data analysis apparatus.

Next, the hardware configurations of the data collection apparatus 140 and the data analysis apparatus 150 will be described. FIG. 11 is a drawing illustrating an example of the hardware configuration of a data collection apparatus and a data analysis apparatus.

(1) Data Collection Apparatus

As illustrated in FIG. 11, the data collection apparatus 140 includes a processor 1101, a memory 1102, an auxiliary storage device 1103, an interface (I/F) device 1104, a communication device 1105, and a drive device 1106. The respective hardware components of the data collection apparatus 140 are connected to each other through a bus 1107.

The processor 1101 includes various arithmetic devices such as a central processing unit (CPU) and a graphics processing unit (GPU). The processor 1101 reads various programs (e.g., data collection programs) onto the memory 1102 to execute the programs.

The memory 1102 includes a main storage device such as a read only memory (ROM) and a random access memory (RAM). The processor 1101 and the memory 1102 form what is called a computer. The processor 1101 executes various programs read onto the memory 1102, so that the computer achieves the various functions described above.

The auxiliary storage device 1103 stores various programs, and stores various data and the like used when the various programs are executed by the processor 1101. The above-described collected data storage unit 250 is implemented in the auxiliary storage device 1103.

The I/F device 1104 is a connection device for connecting the display device 1108, the operating device 1109, and the data collection apparatus 140.

The communication device 1105 is a communication device for communicating via a network with the substrate processing apparatus 110, the substrate processing apparatus A 120, the substrate processing apparatus B 131 to the substrate processing apparatus D 133, the shape measurement apparatus 1110, the data analysis apparatus 150, and the like.

The drive device 1106 is a device to which a recording medium 1111 is set. Here, the recording medium 1111 includes a medium for optically, electrically, or magnetically recording information, such as a CD-ROM, a flexible disk, a magneto-optical disk, or the like. The recording medium 1111 may also include a semiconductor memory or the like that electrically records information, such as a ROM, a flash memory, or the like.

The various programs to be installed in the auxiliary storage device 1103 installed by setting the recording medium 1111 in the drive device 1106 and reading the various programs recorded in the recording medium 1111, for example. Alternatively, the various programs to be installed in the auxiliary storage device 1103 may be installed upon being downloaded from a network (not shown) via the communication device 1105.

(2) Data Analysis Apparatus

As illustrated in FIG. 11, the hardware configuration of the data analysis apparatus 150 is similar to the hardware configuration of the data collection apparatus 140. Therefore, the differences from the data collection apparatus 140 will be described herein.

In the case of the data analysis apparatus 150, the processor 1121 reads a data analysis program from the memory 1122 to execute the data analysis program.

In the case of the data analysis apparatus 150, the communication device 1125 communicates with the substrate processing apparatus 110 and the data collection apparatus 140.

SUMMARY

As is apparent in the description above, the collection system according to the first embodiment:

- includes: the substrate processing apparatus A having the first chamber; the substrate processing apparatuses B to D having the second chambers different from the first chamber; and the data collection apparatus 140 connected to the substrate processing apparatus A and the substrate processing apparatuses B to D;
- compares the various observed data observed when substrates having the same or similar shapes are processed under the same conditions in the first chamber and the second chamber, respectively, and calculates the correction amount for correcting the various observed data observed when being processed in the second chamber; and
- when searching for the optimal processing conditions by processing substrates while changing the processing conditions in the second chamber, corrects the observed data observed when being processed in the second chamber based on the correction amount, and collects the corrected observed data.

In this way, the collection system according to the first embodiment uses a plurality of substrate processing apparatuses to process substrates having the same or similar shapes under the same conditions, and collects observed data obtained by correcting the influence of disturbances. Thereby, according to the first embodiment, various observed data that are appropriate (without the influence of disturbances) in the search for processing conditions in substrate processing can be collected.

In the collection system according to the first embodiment, the first chamber is configured the same as the reference chamber of the reference substrate processing apparatus, and the calibration amount based on machine differences is calculated based on various observed data observed when substrates having the same or similar shapes are processed under the same conditions in the reference chamber and the first chamber, respectively.

Thereby, according to the first embodiment, various observed data that are appropriate (without the influence of the machine differences) in the search for processing conditions in substrate processing can be collected.

In the collection system according to the first embodiment, the second chambers of the substrate processing apparatuses B to D are additionally provided with the plasma probe, the consumption amount sensor, and the particle sensor to collect and display various measured data (plasma measured data, consumption amount measured data, and particle measured data) during the processing of the substrate.

Thereby, according to the first embodiment, the processing conditions can be changed while referring to various measured data that are detailed data representing the state inside the chamber, so that the optimal processing conditions can be efficiently searched for.

The collection system according to the first embodiment:

generates the learned virtual measurement model for predicting various measurement data during substrate processing; and performs the learning process including various measured data during the substrate processing to generate the learned shape simulation model.

Thereby, the prediction accuracy of the learned shape simulation model can be improved. Further, the processing conditions can be narrowed by using the learned shape simulation model, so that the optimal processing conditions can be efficiently searched for.

Further, in the collection system according to the first embodiment, the generated learned virtual measurement model and the generated shape simulation model are installed in the mass-produced substrate processing apparatus.

Thereby, various measured data that cannot be monitored in the related art when substrates are processed in the mass-produced substrate processing apparatus can be monitored. Further, the shape data of the processed substrate can be predicted and displayed, so that it can be determined whether the processed substrates are good or bad without inspecting all the processed substrates.

Second Embodiment

The data collection system 100 according to the first embodiment has been described with respect to a case in which the substrate processing apparatus A (mass-produced) the same as the substrate processing apparatus installed in the substrate manufacturer (reference substrate processing apparatus) is installed in the substrate processing apparatus manufacturer. However, the configuration of the data collection system is not limited thereto. For example, the data collection system may be configured without installing the substrate processing apparatus A in the substrate processing apparatus manufacturer. Hereinafter, a data collection system according to a second embodiment will be described.

<Outline of Configuration and Processing of Data Collection System>

First, an outline of a configuration of the data collection system according to the second embodiment and processing executed by the data collection system according to the second embodiment will be described. FIG. 12 is a diagram illustrating the outline of the configuration and the processing of a data collection system according to a second embodiment.

As illustrated in FIG. 12, a data collection system 1200 includes:

a substrate processing apparatus A 1210, which is an example of the first substrate processing apparatus;

the substrate processing apparatus B 131, the substrate processing apparatus C 132, and the substrate processing apparatus D 133, which are examples of the second substrate processing apparatus;

the data collection apparatus 140; and the data analysis apparatus 150. For the sake of convenience of description, the present embodiment has a system configuration in which the substrate processing apparatus A 1210 is installed in the substrate manufacturer instead of the substrate processing apparatus 110.

Similar to the first embodiment, the data collection system 1200 is used in, for example, scenes where the substrate processing apparatus manufacturer supports a substrate manufacturer so that substrates having a target substrate shape can be mass-produced by the substrate manufacturer.

The substrate processing apparatus A 1210 is installed in, for example, a substrate manufacturer (mass-produced). The substrate processing apparatus A 1210 has a first chamber, and processes substrates under predetermined processing conditions. The substrate processing apparatus A 1210 is provided with various observation sensors to output observed data observed by the various observation sensors during the processing of the substrate.

Since the substrate processing apparatus B 131 to the substrate processing apparatus D 133, the data collection apparatus 140, and the data analysis apparatus 150 illustrated in FIG. 12 are similar to those illustrated in FIG. 1, descriptions thereof will be omitted.

Since each process included in the "experimental phase for searching for optimal conditions" is the same as that in FIG. 1 except that the calibration amount calculation process (step S161) is not included, descriptions thereof will be omitted.

Since each processing included in the "processing phase under optimal conditions" is also the same as that in FIG. 1 except that by being executed by the substrate processing apparatus A 1210, descriptions thereof will be omitted.

Specific Example of Process Executed by Data Collection System

Next, a specific example of the correction amount calculation process (step S162) among the processes executed by the data collection system 1200 will be described.

(1) Specific Example of Correction Amount Calculation Process (Step S162)

Figure 13:
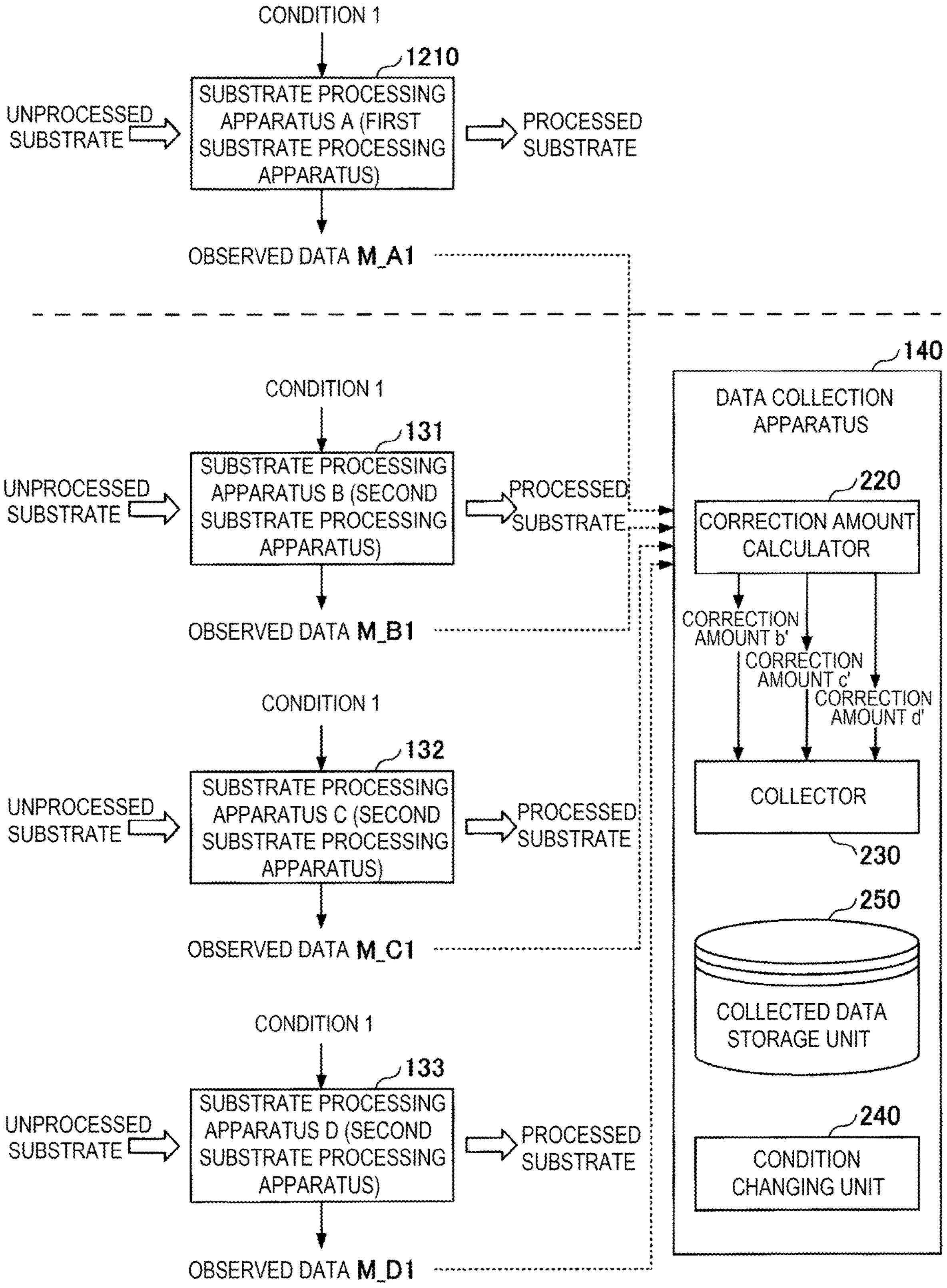
FIG. 13 is a diagram illustrating a specific example of a correction amount calculation process executed by the data collection system according to the second embodiment.

FIG. 13 is a diagram illustrating a specific example of a correction amount calculation process executed by the data collection system according to the second embodiment.

The example of FIG. 13 illustrates a state in which the substrate processing apparatus A 1210 and the substrate processing apparatuses B 131 to D 133 process unprocessed substrates having the same or similar shapes under the processing condition="condition 1". Further, the example of FIG. 13 illustrates a state of outputting observed data="observed data M_A1" to "observed data M_D1", respectively, from the substrate processing apparatus A 1210 and the substrate processing apparatuses B 131 to D 133.

The difference from FIG. 3 is that in the case of FIG. 13, the correction amount calculator 220 calculates correction amounts b', c', and d' (correction amounts for eliminating the effects of both the machine differences and the disturbances) as correction amounts for matching the obtained observed data="observed data M_A1".

SUMMARY

As is apparent from the above description, the data collection system according to the second embodiment:

- forms a data collection system without installing the substrate processing apparatus A the same as the substrate processing apparatus installed in the substrate manufacturer (reference substrate processing apparatus) in the substrate processing apparatus manufacturer;
- compares the various observed data observed when substrates having the same or similar shapes are processed under the same conditions in the first chamber and the second chamber, respectively, and calculates the correction amount for correcting the various observed data observed when being processed in the second chamber; and
- when searching for the optimal processing conditions by processing substrates while changing the processing conditions in the second chamber, corrects the observed data observed when being processed in the second chamber based on the correction amount, and collects the corrected observed data.

Thereby, according to the second embodiment, various observed data that are appropriate (without the influence of the machine differences or the influence of the disturbances) in the search for processing conditions in substrate processing can be collected.

Third Embodiment

The first and second embodiments have been described with respect to a case in which correction amounts of various observed data are calculated in the correction amount calculation process (steps S162 and S167). In contrast, in a third embodiment, correction amounts are also calculated with respect to various measured data (specifically, the particle measured data) in the correction amount calculation process. Hereinafter, the third embodiment will be described with a focus on the differences from the first and second embodiments.

FIG. 14 is a diagram illustrating a specific example of a correction amount calculation process executed by a data collection system according to the third embodiment. The example of FIG. 14 illustrates a state in which the substrate processing apparatus A 1210 processes an unprocessed QC substrate under the processing condition="condition 0" to obtain a processed QC substrate, and the particle measured data="particle measured data A0".

The example of FIG. 14 illustrates a state in which the substrate processing apparatus D 133 processes an unprocessed substrate to output particle measured data="particle measured data D0".

In the data collection system according to the third embodiment, a correction amount calculator 1410 operates in the correction amount calculation process (steps S162 and S167). At this time, the correction amount calculator 1410 acquires the particle measured data="particle measured data A0", "particle measured data D0" output from the substrate processing apparatus A 1210 and the substrate processing apparatus D 133.

The correction amount calculator 1410 calculates a correction amount p for matching the acquired the particle measured data="particle measured data D0" with the particle measured data="particle measured data A0", and notifies the collector 230. Thereby, the data collection apparatus 140 can store the particle measured data output from the substrate processing apparatus D 133 in the collected data storage unit 250 after correcting using the correction amount p.

Thereby, according to the third embodiment, the measured data that are appropriate (without the influence of the machine differences or the influence of the disturbances) in the search for processing conditions in substrate processing can be collected.

Fourth Embodiment

The first to third embodiments have been described with respect to a case in which the optimal processing conditions for achieving the target substrate shape can be found in the condition narrowing process (step S168). However, it may be assumed that the data analysis apparatus 150 cannot find the optimal processing conditions.

In this case, the determination result that the target substrate shape cannot be achieved simply by changing the current processing conditions may be output.

Further, a change to the processing conditions other than the current processing conditions may be proposed. The change of the processing conditions other than the current processing conditions referred to herein include, for example, pulse modulation, impedance control, and the like.

Other Embodiments

The first to fourth embodiments have not described specific examples of the substrate processing by the substrate processing apparatus. However, the substrate processing by the substrate processing apparatus may include, for example, a film formation process and an etching process. Further, the first to fourth embodiments have not described specific examples of the substrate processing apparatus. However, the substrate processing apparatus may include an etching apparatus, a film forming apparatus, an ashing apparatus, an annealing apparatus, a doping apparatus, and the like.

The first to fourth embodiments have exemplified data relating to the appearance of the substrate, such as the critical dimension, the depth, the taper angle, the tilt angle, and the bowing, as the substrate shape data. However, the substrate shape data is not limited to data relating to the appearance of the substrate. For example, the substrate shape data may include data other than data relating to the appearance of the substrate, such as the film thickness, the film type, the film characteristics, and the like.

The "same processing conditions" in the first to fourth embodiments are not limited to the case where the processing conditions are completely the same, and may include, for example, processing conditions under which the same effect is obtained in changes in substrate shape data before and after the processing. The term "the same effect" used herein does not need to indicate that changes in substrate shape data before and after processing are completely the same, but refers to changes in substrate shape data that are similar to each other (within a predetermined range).

The term "substrates having the same or similar shapes" in the first to fourth embodiments refers to those having the same degree of substrate shape data (within a predetermined range).

The first embodiment has exemplified the plasma measured data, the consumption amount measured data, and the particle measured data as the various measured data. However, the present disclosure is not limited thereto, and may include other measured data.

The first embodiment has described a case in which the various measured data are measured by the sensors provided in the substrate processing apparatus. However, the various measured data may be acquired from outside the substrate processing apparatus. That is, the other measured data may include, for example, component analysis data based on X-ray photoelectron spectroscopy (XPS). Alternatively, the other measured data may include characteristic data or the like obtained through processing by another processing apparatus.

In the first to fourth embodiments, the data collection apparatus 140 and the data analysis apparatus 150 are provided separately. However, the data collection apparatus 140 and the data analysis apparatus 150 may be integrated with each other.

In the first to fourth embodiments, the data collection apparatus 140 and the data analysis apparatus 150 are configured separately from the substrate processing apparatus 110, the substrate processing apparatus A 120, and the substrate processing apparatuses B 131 to D 133. However, the data collection apparatus 140 or the data analysis apparatus 150 may be provided in the substrate processing apparatus 110, the substrate processing apparatus A 120, or the substrate processing apparatuses B 131 to D 133.

The first to fourth embodiments have been described with respect to a case in which the data collection apparatus 140 and the data analysis apparatus 150 individually execute the data collection program and the data analysis program. However, the data collection apparatus 140 and the data analysis apparatus 150 may be constituted by, for example, a plurality of computers, and the data collection program or the data analysis program may be executed in a distributed computing form by installing the data collection program or the data analysis program in the respective computers.

The first to fourth embodiments have exemplified the method of downloading and installing the program through a network as the method for installing the data collection program in the auxiliary storage device 1103 of the data collection apparatus 140. Further, the method of downloading and installing the program through a network has been exemplified as the method for installing the data analysis program in the auxiliary storage device 1123 of the data analysis apparatus 150. At this time, the download source has not been described particularly. However, when installing by this method, the download source may be, for example, a server apparatus that stores the data collection program or the data analysis program in an accessible manner. The server apparatus may be an apparatus on a cloud that receives access from each of the data collection apparatus 140 and the data analysis apparatus 150 via a network, and allows download of the data collection program or the data analysis program based on accounting. In other words, the server apparatus may be an apparatus on a cloud that provides a service of the data collection program or the data analysis program.

The first to fourth embodiments have not described the details of the virtual measurement model. However, the virtual measurement model used in the first to fourth embodiments may be, for example, an ARX model. Further, the first to fourth embodiments have not described the details of the shape simulation model. However, the shape simulation model used in the first to fourth embodiments may be, for example, a model based on a convolution neural network. The various models used in the first to fourth embodiments are not limited to these examples, and may be, for example, a model learned by machine learning involving other depth learning, a statistical model, or a model obtained by combining these models.

The present invention is not limited to the configurations described in connection with the embodiments that have been described heretofore, or to the combinations of these configurations with other elements. Various variations and modifications may be made without departing from the scope of the present invention, and may be adopted according to applications.

What is claimed is:

1. A data collection system comprising:

a first substrate processing apparatus having a first processing space, a second substrate processing apparatus having a second processing space different from the first processing space, and a data collection apparatus connected to the first substrate processing apparatus and the second substrate processing apparatus, the data collection apparatus including a processor, wherein the data collection apparatus is configured to:

compare observed data observed when substrates having the same or similar shapes are processed under the same processing conditions in the first processing space and the second processing space, respectively, and calculate a correction amount for correcting the observed data observed when being processed in the second processing space, and correct, based on the correction amount, the observed data observed when being processed while changing a processing condition in the second processing space and collect the corrected observed data as the observed data observed when being processed in the first processing space, wherein the second substrate processing apparatus is additionally provided with a sensor that is not installed in the first substrate processing apparatus.

2. The data collection system according to claim 1, wherein the first processing space is the same as a reference processing space, the data collection apparatus is further configured to calculate a calibration amount based on a machine difference from observed data observed when substrates having the same or similar shapes are processed under the same processing conditions in the reference processing space and the first processing space, respectively, and the observed data observed when being processed in the first processing space to be compared with when the data collection apparatus calculates the correction amount is observed data calibrated based on the calibration amount.

3. The data collection system according to claim 1, wherein the data collection apparatus collects measured data detected by the additionally installed sensor when searching for the processing condition by processing substrates while changing the processing condition in the second processing space.

4. The data collection system according to claim 1, wherein the second substrate processing apparatus includes at least one of a substrate processing apparatus additionally provided with a sensor configured to measure plasma in the second processing space, a substrate processing apparatus additionally provided with a sensor configured to measure a consumption amount of a component in the second processing space, or a substrate processing apparatus additionally provided with a sensor configured to measure a particle in the second processing space.

5. The data collection system according to claim 3, wherein when searching for the processing condition by processing substrates while changing the processing condition in the second processing space, the data collection system displays measured data measured by the additionally provided sensor.

6. The data collection system according to claim 1, wherein the data collection apparatus is further configured to perform a learning process on a virtual measurement model, using, as input data, the corrected observed data collected by the data collection apparatus and using, as ground truth data, the measured data collected by the data collection apparatus.

7. The data collection system according to claim 6, wherein the first substrate processing apparatus includes the learned virtual measurement model, and the first substrate processing apparatus displays measurement data predicted by inputting the observed data observed when being processed in the first processing space into the learned virtual measurement model.

8. The data collection system according to claim 6, wherein the data collection apparatus is further configured to perform a learning process on a shape simulation model, using, as input data, the corrected observed data collected by the data collection apparatus, the measured data collected by the data collection apparatus, and the processing condition for processing the substrates in the second processing space, and using, as ground truth data, shape data of processed substrates obtained by processing the substrates while changing the processing condition in the second processing space.

9. The data collection system according to claim 8, further comprising:

the learned shape simulation model, wherein the data collection apparatus is further configured to, when searching for the processing condition by processing substrates while changing the processing condition in the second processing space, narrow processing conditions to cause shape data of a processed substrate predicted by the learned shape simulation model to approach target shape data.

10. The data collection system according to claim 9, wherein the data collection apparatus is further configured to narrow processing conditions for collecting corrected observed data and measured data used for performing a relearning process on the learned shape simulation model, based on prediction accuracy of the shape data of the processed substrate predicted by the learned shape simulation model.

11. The data collection system according to claim 9, wherein the data collection apparatus is further configured to, when searching for the processing condition by processing substrates while changing the processing condition in the second processing space, predict the shape data of the processed substrate using the learned shape simulation model, thereby determining whether a processing condition under which a difference from the target shape data is less than a predetermined threshold value can be found.

12. The data collection system according to claim 8, wherein the first substrate processing apparatus includes the learned shape simulation model, and the first substrate processing apparatus displays shape data of a processed substrate predicted by inputting, into the learned shape simulation model, the observed data observed when being processed in the first processing space, measurement data predicted by inputting the observed data into the learned virtual measurement model, and the processing condition for processing the substrate in the first processing space.

13. The data collection system according to claim 1, wherein the sensor is configured to measure data related to the second substrate processing apparatus.

14. A data collection apparatus for being connected to a first substrate processing apparatus having a first processing space and a second substrate processing apparatus having a second processing space different from the first processing space, the data collection apparatus comprising:

a processor; and a memory storing program instructions that cause the processor to:

compare observed data observed when substrates having the same or similar shapes are processed under the same processing conditions in the first processing space and the second processing space, respectively, and calculate a correction amount for correcting the observed data observed when being processed in the second processing space, and correct, based on the correction amount, the observed data observed when being processed while changing a processing condition in the second processing space based on the correction amount, and collect corrected observed data as the observed data observed when being processed in the first processing space, wherein the second substrate processing apparatus is additionally provided with a sensor that is not installed in the first substrate processing apparatus.

15. A data collection method for a data collection apparatus connected to a first substrate processing apparatus having a first processing space and a second substrate processing apparatus having a second processing space different from the first processing space, the data collection apparatus including a processor, the data collection method comprising:

comparing observed data observed when substrates having the same or similar shapes are processed under the same processing conditions in the first processing space and the second processing space, respectively, and calculating a correction amount for correcting the observed data observed when being processed in the second processing space, and correcting, based on the correction amount, the observed data observed when being processed while changing a processing condition in the second processing space, and collecting corrected observed data as the observed data observed when being processed in the first processing space, wherein the second substrate processing apparatus is additionally provided with a sensor that is not installed in the first substrate processing apparatus.

16. A non-transitory computer-readable recording medium having stored therein a data collection program for causing a computer of a data collection apparatus connected to a first substrate processing apparatus having a first processing space and a second substrate processing apparatus having a second processing space different from the first processing space, the data collection apparatus including a processor, to perform:

comparing observed data observed when substrates having the same or similar shapes are processed under the same processing conditions in the first processing space and the second processing space, respectively, and calculating a correction amount for correcting the observed data observed when being processed in the second processing space, and correcting, based on the correction amount, the observed data observed when being processed while changing a processing condition in the second processing space, and collecting corrected observed data as the observed data observed when being processed in the first processing space, wherein the second substrate processing apparatus is additionally provided with a sensor that is not installed in the first substrate processing apparatus.

* * * * *